US006223192B1

(12) United States Patent
Oberman et al.

(10) Patent No.: US 6,223,192 B1
(45) Date of Patent: *Apr. 24, 2001

(54) BIPARTITE LOOK-UP TABLE WITH OUTPUT VALUES HAVING MINIMIZED ABSOLUTE ERROR

(75) Inventors: Stuart F. Oberman, Sunnyvale; Norbert Juffa, San Jose, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/098,482

(22) Filed: Jun. 16, 1998

Related U.S. Application Data

(63) Continuation-in-part of application No. 09/015,436, filed on Jan. 29, 1998.
(60) Provisional application No. 60/063,600, filed on Oct. 23, 1997.

(51) Int. Cl.[7] ................. G06F 1/02; G06F 7/38

(52) U.S. Cl. ............. 708/270; 708/502; 708/605

(58) Field of Search ................ 708/270, 271, 708/272, 273, 274, 275, 276, 277, 290, 582, 504, 605, 650, 653, 654

(56) References Cited

U.S. PATENT DOCUMENTS

| 5,184,317 | * | 2/1993 | Pickett | 708/446 |
| 5,321,642 | * | 6/1994 | Goldberg | 708/276 |
| 5,862,059 | * | 1/1999 | Matula et al. | 708/270 |

FOREIGN PATENT DOCUMENTS

| 0 239 899 | 10/1987 | (EP) . |
| 0 754 998 | 1/1997 | (EP) . |

OTHER PUBLICATIONS

Oberman, et al, "Design Issues in Division and Other Floating–Point Operations," IEEE Transactions on Computers, vol. 46, Feb. 1997, pp. 154–161.

Ito, et al, "Efficient Initial Approximation for Multiplicative Division and Square Root by a Multiplication with Operand Modification," IEEE Transactions on Computers, vol. 46, No. 4, Apr. 1997.

(List continued on next page.)

Primary Examiner—Chuong Dinh Ngo
(74) Attorney, Agent, or Firm—Conley, Rose & Tayon, P.C.

(57) ABSTRACT

A method for generating entries for a bipartite look-up table having base and difference table portions. In one embodiment, these entries are usable to form output values for a mathematical function, f(x), in response to receiving corresponding input values within a predetermined input range. The method first comprises partitioning the input range into I intervals, J subintervals/interval, and K sub-subintervals/subinterval. For a given interval M, the method includes generating K difference table entries and J base table entries. Each of the K difference table entries corresponds to a particular group of sub-subintervals within interval M, each of which has the same relative position within their respective subintervals. Each difference table entry is computed by averaging difference values for the sub-subintervals included in a corresponding group N. Each difference value which makes up this average is equal to f(X1)−f(X2), where X1 is the midpoint of the sub-subinterval within group N, and X2 is the midpoint of a predetermined reference sub-subinterval within the same subinterval as X1. Each of these midpoints is calculated such that maximum absolute error is minimized for all possible input values in the sub-subinterval. Each of the J base table entries, on the other hand, corresponds to a subinterval within interval M. Each entry is equal to f(X2)+adjust, where X2 is the midpoint of the reference sub-subinterval of the subinterval corresponding to the base table entry. The adjust value is calculated so that error introduced by the averaging of the difference table entries is evenly distributed over the entire subinterval.

32 Claims, 19 Drawing Sheets

OTHER PUBLICATIONS

Foley, "Computer Graphics: Principles and Practice," published by Addison–Wesley Pub Co., 1995, pp. 866–876.

Turkowski, "Computing the Inverse Square Root," published by Academic Press, Inc., 1995, pp. 16–21.

Takagi, "Generating a Power of an Operand by a Table Look–up and a Multiplication," IEEE publication, published 1997, pp. 126–131.

Das Sarma, et al, "Faithful Interpolation in Reciprocal Tables," IEEE publication, published 1997, pp. 82–91.

Das Sarma, et al, "Faithful Bipartite ROM reciprocal Tables," IEEE publication, published 1995, pp. 17–28.

Das Sarma, "Measuring the Accuracy of ROM Reciprocal Tables," IEEE publication, published 1993, pp. 95–102.

Schulte et al., "Symmetric Bipartite Tables for Accurate Function Approximation," Department of Electrical Engineering and Computer Science Lehigh University, 1997, pp. 175–183.

Hassler et al., "Function Evaluation by Table Look–up and Addition," Department of Information Engineering Nagoya University, 1995, pp. 10–16.

* cited by examiner

BIPARTITE LOOK-UP TABLE WITH OUTPUT VALUES HAVING MINIMIZED ABSOLUTE ERROR

CROSS-REFERENCE TO RELATED APPLICATIONS

This application is a continuation-in-part of U.S. Pat. Application No. 09/015,436, filed on Jan. 29, 1998, now abandoned.

This application claims the benefit of U.S. Provisional Application No. 60/063,600, filed Oct. 23, 1997, titled "Method And Apparatus For Reciprocal And Reciprocal Square Root," by Norbert Juffa and Stuart F. Oberman.

BACKGROUND OF THE INVENTION

1. Field of the Invention

The present invention relates to the field of floating-point arithmetic, and, more specifically, to a method for generating look-up table entries for evaluation of mathematical functions.

2. Description of the Related Art

Floating-point instructions are used within microprocessors to perform high-precision mathematical operations for a variety of numerically-intensive applications. Floating-point arithmetic is particularly important within applications that perform the rendering of three-dimensional graphical images. Accordingly, as graphics processing techniques grow more sophisticated, a corresponding increase in floating-point performance is required.

Graphics processing operations within computer systems are typically performed in a series of steps referred to collectively as the graphics pipeline. Broadly speaking, the graphics pipeline may be considered as having a front end and a back end. The front end of receives a set of vertices and associated parameters which define a graphical object in model space coordinates. Through a number of steps in the front end of the pipeline, these vertices are assembled into graphical primitives (such as triangles) which are converted into screen space coordinates. One distinguishing feature of these front-end operations (which include view transformation, clipping, and perspective division) is that they are primarily performed using floating-point numbers. The back end of the pipeline, on the other hand, is typically integer-intensive and involves the rasterization (drawing on a display device) of geometric primitives produced by the front end of the pipeline.

High-end graphics systems typically include graphics accelerators coupled to the microprocessor via the system bus. These graphics accelerators include dedicated hardware specifically designed for efficiently performing operations of the graphics pipeline. Most consumer-level graphics cards, however, only accelerate the rasterization stages of the graphics pipeline. In these systems, the microprocessor is responsible for performing the floating-point calculations in the initial stages of the graphics pipeline. The microprocessor then conveys the graphics primitives produced from these calculations to the graphics card for rasterizing. For such systems, it is clear that increased microprocessor floating-point performance may result in increased graphics processing capability.

One manner in which floating-point performance may be increased is by optimizing the divide operation. Although studies have shown that division represents less than 1% of all instructions in typical floating-point code sequences (such as SPECfp benchmarks), these instructions occupy a relatively large portion of execution time. (For more information on the division operation within floating-point code sequences, please refer to "Design Issues in Division and Other Floating-Point Operations", by Stuart F. Oberman and Michael J. Flynn, published in *IEEE Transactions on Computers*, Vol. 46, No. 2, February 1997, pp. 154–161). With regard to the front-end stages of the graphics pipeline, division (or, equivalently, the reciprocal operation) is particularly critical during the perspective correction operation. A low-latency divide operation may thus prevent a potential bottleneck and result in increased graphics processing performance.

One means of increasing performance of the divide operation is through the use of dedicated floating-point division hardware. Because floating-point hardware is relatively large as compared to comparable fixed-point hardware, however, such an implementation may use a significant portion of the hardware real estate allocated to the floating-point unit. An alternate approach is to utilize an existing floating-point element (such as a multiplier) to implement division based on iterative techniques like the Goldschmidt or Newton-Raphson algorithms.

Iterative algorithms for division require a starting approximation for the reciprocal of the divisor. A predetermined equation is then evaluated using this starting approximation. The result of this evaluation is then used for a subsequent evaluation of the predetermined equation. This process is repeated until a result of the desired accuracy is reached. In order to achieve a low-latency divide operation, the number of iterations needed to achieve the final result must be small. One means to decrease the number of iterations in the division operation is to increase the accuracy of the starting approximation. The more accurately the first approximation is determined, then, the more quickly the division may be performed.

Starting approximations for floating-point operations such as the reciprocal function are typically obtained through the use of a look-up table. A look-up table is a read-only memory (ROM) which stores a predetermined output value for each of a number of regions within a given input range. For floating-point functions such as the division operation, the look-up table is located within the microprocessor's floating-point unit. An input range for a floating-point function is typically bounded by a single binade of floating point values (a "binade" refers to a range of numbers between consecutive powers of 2). Input ranges for other floating-point functions, however, may span more than one binade.

Because a single output value is assigned for each region within a function's input range, some amount of error is inherently introduced into the result provided by the table look-up operation. One means of reducing this error is to increase the number of entries in the look-up table. This limits the error in any given entry by decreasing the range of input arguments. Often times, however, the number of entries required to achieve a satisfactory degree of accuracy in this manner is prohibitively large. Large tables have the unfortunate properties of occupying too much space and slowing down the table look-up (large tables take longer to index into than relatively smaller tables).

In order to decrease table size while still maintaining accuracy, "bipartite" look-up tables are utilized. Bipartite look-up tables actually include two separate tables: a base value table and a difference value table. The base table includes function output values (or "nodes") for various regions of the input range. The values in the difference table are then used to calculate function output values located between nodes in the base table. This calculation may be performed by linear interpolation or various other techniques. Depending on the slope of the function for which the bipartite look-up table is being constructed, table storage requirements may be dramatically reduced while maintaining a high level of accuracy. If the function changes slowly, for example, the number of bits required for difference table entries is much less than the number of bits in the base table entries. This allows the bipartite table to be implemented with fewer bits than a comparable naïve table (one which does not employ interpolation).

Prior art bipartite look-up tables provide output values having a minimal amount of maximum relative error over a given input interval. This use of relative error to measure the accuracy of the look-up table output values is questionable, however, because of a problem known as "wobbling precision". Wobbling precision refers to the fact that a difference in the least significant bit of an input value to the look-up table has twice the relative error at the end of a binade than it has at the start of the binade. A look-up table constructed in this manner is thus not as accurate as possible.

It would therefore be desirable to have a bipartite look-up table having output values with improved accuracy.

SUMMARY OF THE INVENTION

The problems outlined above are in large part solved by a method for generating entries for a bipartite look-up table which includes a base table portion and a difference table portion. In one embodiment, these entries are usable to form output values for a given mathematical function (denoted as $f(x)$) in response to receiving corresponding input values ($x$) within a predetermined input range. For example, the bipartite look-up table may be used to implement the reciprocal function or the reciprocal square root function, both of which are useful for performing 3-D graphics operations.

The method first comprises partitioning the input range of the function into intervals, subintervals, and sub-subintervals. This first includes dividing the predetermined input range into a predetermined number (I) of intervals. Next, the I intervals are each divided into J subintervals, resulting in I*J subintervals for the input range. Finally, each of the I*J subintervals is divided into K sub-subintervals, for a total of I*J*K sub-subintervals over the input range.

The method next includes generating K difference table entries for each interval in the predetermined input range. Each of the K difference table entries for a given interval corresponds to a particular group of sub-subintervals within the given interval. In one embodiment, this particular group of sub-subintervals includes one sub-subinterval per subinterval of the given interval. Additionally, each sub-subinterval in the particular group has the same relative position within its respective subinterval. For example, one of the K difference table entries for the given interval may correspond to a first group of sub-subintervals wherein each sub-subinterval is the last sub-subinterval within its respective subinterval.

In order to generate a first difference table entry for a selected interval (M), a group of sub-subintervals (N) within interval M is selected to correspond to the first entry. The calculation of the first entry then begins with a current subinterval (P), which is bounded by input values A and B. A midpoint X1 is calculated for current subinterval P such that $f(A)-f(X1)=f(X1)-f(B)$. (By calculating the midpoint in this way, maximum possible absolute error is minimized for all input values within the sub-subinterval). Next, a midpoint X2 is computed in a similar fashion for a predetermined reference sub-subinterval within current subinterval P. (The reference sub-subinterval refers to the sub-subinterval within each subinterval that corresponds to the base table entry). A difference value, $f(X1)-f(X2)$, is then computed for current subinterval P.

In this manner, a difference value is computed for each sub-subinterval in group N. A running total is maintained of each of these difference values. The final total is then divided by J, the number of subintervals in the selected intervals, in order to generate the difference value average for interval M, sub-subinterval group N. In one embodiment, the difference value average is converted into an integer value before being stored to the difference table portion of the bipartite look-up table.

The above-described steps are usable to calculate a single difference table entry for interval M. In order to calculate the remaining difference table entries for the selected interval, each remaining group of sub-subintervals is selected in turn, and a corresponding difference value average is computed. In this manner, the additional K−1 difference table entries may be generated for interval M. Difference table entries for any additional intervals in the predetermined input range are calculated in a similar manner.

The method next includes generating J base table entries for each interval in the predetermined input range. Each of the J base table entries for a given interval corresponds to a particular subinterval within the given interval. For example, one of the J base table entries for the given interval may correspond to the first subinterval of the given interval.

In a similar manner to the difference table computations, a particular interval (M) of the predetermined input range is selected for which to compute the J base table entries. Next, a subinterval of interval M is chosen as a currently selected subinterval P. Typically, the first subinterval is initially chosen as subinterval P.

The method then includes calculating an initial base value, B, where $B=f(X2)$. (As stated above, X2 is the midpoint of the reference sub-subinterval of subinterval P of interval M). Subsequently, a difference value, D, is computed, where $D=f(X3)$. (X3 is the midpoint of the sub-subinterval within subinterval P which is furthest from the reference sub-subinterval. For example, if the reference sub-subinterval is the last sub-subinterval in subinterval P, X3 is computed for the first sub-subinterval in P).

The actual maximum midpoint difference for subinterval P is given by D−B. A reference is then made to the previously computed difference table entry for the sub-subinterval (or, more appropriately, the sub-subinterval group) within interval M which corresponds to the sub-subinterval for which D is computed. Since this value is computed by difference averaging as described above, the difference average differs from the quantity D−B.

The difference of the actual difference value and the average difference value is the maximum error for subinterval P. An adjust value is then computed as a fraction of this maximum error value. (In one embodiment, the adjust value is half of the maximum error value in order to evenly distribute the error over the entire subinterval). The final base value is calculated by adding the adjust value (which may be positive or negative) to the initial base value B. In one embodiment, this final base value may be converted to an integer for storage to the base table portion of the bipartite look-up table. The steps described above are repeated for the remaining subintervals in the selected interval, as well as for the subintervals of the remaining intervals of the predetermined input range.

In one embodiment, the output values of the bipartite look-up table are simply the sum of selected base and difference table entries. If these entries are calculated as described above, the resultant output values of the table will have a minimal amount of possible absolute error. Additionally, this minimized absolute error is achieved within a bipartite table configuration, which allows reduced storage requirements as compared to a naive table of similar accuracy. Furthermore, in an embodiment in which the base and difference values are added to generate the table outputs, this allows the interpolation to be implemented with only the cost of a simple addition. This increases the speed of the table look-up operation, in contrast to prior art systems which often require lengthy multiply-add or multiply instructions as part of the interpolation process.

BRIEF DESCRIPTION OF THE DRAWINGS

Other objects and advantages of the invention will become apparent upon reading the following detailed description and upon reference to the accompanying drawings in which.

Figure 1:
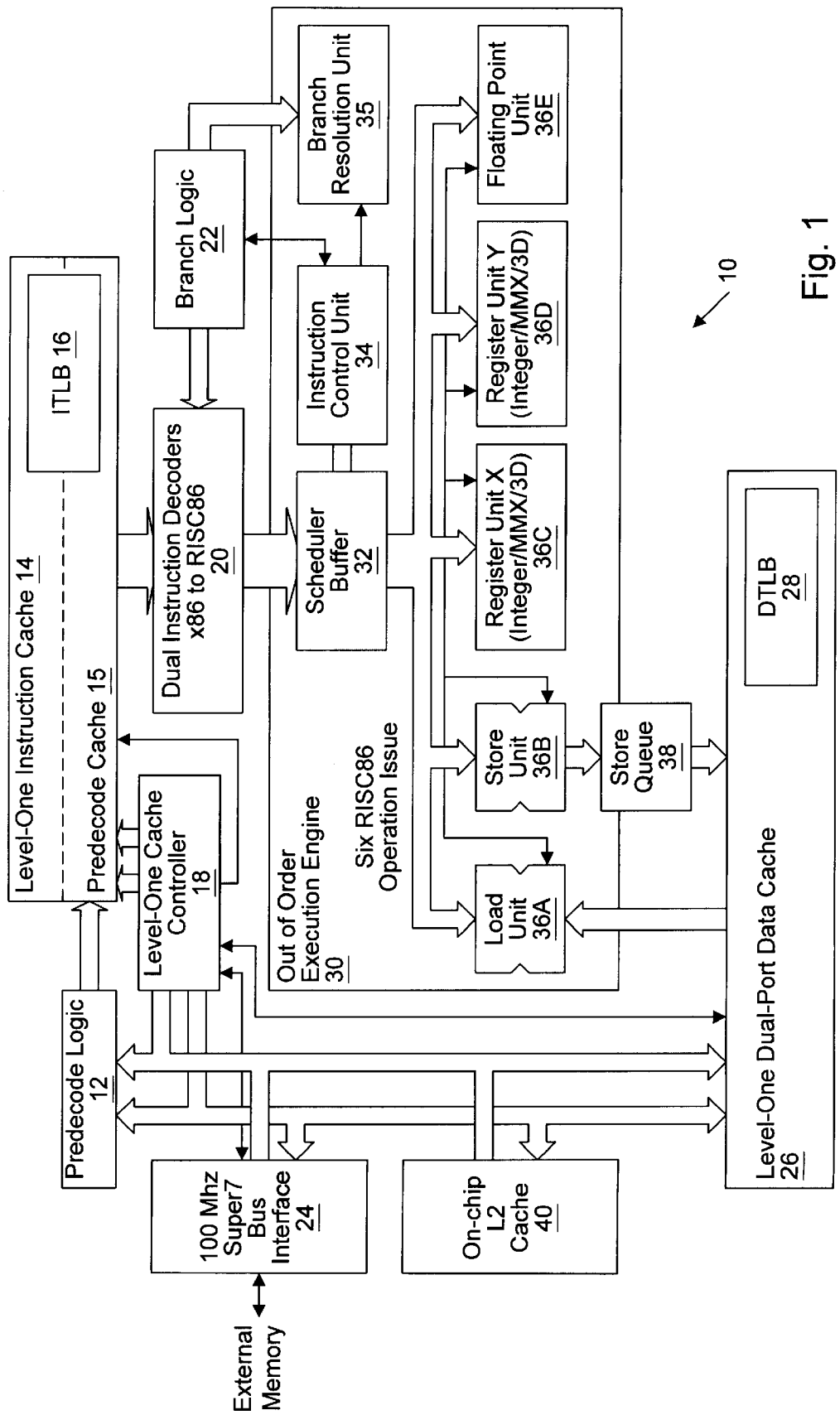
FIG. 1 is a block diagram of a microprocessor which configured according to one embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to FIG. 1, a block diagram of one embodiment of a microprocessor 10 is shown. As depicted, microprocessor 10 includes a predecode logic block 12 coupled to an instruction cache 14 and a predecode cache 15. Caches 14 and 15 also include an instruction TLB 16. A cache controller 18 is coupled to predecode block 12, instruction cache 14, and predecode cache 15. Controller 18 is additionally coupled to a bus interface unit 24, a level-one data cache 26 (which includes a data TLB 28), and an L2 cache 40. Microprocessor 10 further includes a decode unit 20, which receives instructions from instruction cache 14 and predecode data from cache 15. This information is forwarded to execution engine 30 in accordance with input received from a branch logic unit 22.

Execution engine 30 includes a scheduler buffer 32 coupled to receive input from decode unit 20. Scheduler buffer 32 is coupled to convey decoded instructions to a plurality of execution units 36A–E in accordance with input received from an instruction control unit 34. Execution units 36A–E include a load unit 36A, a store unit 36B, an integer X unit 36C, an integer Y unit 36D, and a floating point unit 36E. Load unit 36A receives input from data cache 26, while store unit 36B interfaces with data cache 26 via a store queue 38. Blocks referred to herein with a reference number followed by a letter will be collectively referred to by the reference number alone. For example, execution units 36A–E will be collectively referred to as execution units 36.

Generally speaking, floating point unit 36E within microprocessor 10 includes one or more bipartite look-up tables usable to generate approximate output values of given mathematical functions. As will be described in greater detail below, these bipartite look-up tables are generated such that absolute error is minimized for table output values. In this manner, floating point unit 36E may achieve an efficient implementation of such operations as the reciprocal and reciprocal square root functions, thereby increasing the performance of applications such as three-dimensional graphics rendering.

In one embodiment, instruction cache 14 is organized as sectors, with each sector including two 32-byte cache lines. The two cache lines of a sector share a common tag but have separate state bits that track the status of the line. Accordingly, two forms of cache misses (and associated cache fills) may take place: sector replacement and cache line replacement. In the case of sector replacement, the miss is due to a tag mismatch in instruction cache 14, with the required cache line being supplied by external memory via bus interface unit 24. The cache line within the sector that is not needed is then marked invalid. In the case of a cache line replacement, the tag matches the requested address, but the line is marked as invalid. The required cache line is supplied by external memory, but, unlike the sector replacement case, the cache line within the sector that was not requested remains in the same state. In alternate embodiments, other organizations for instruction cache 14 may be utilized, as well as various replacement policies.

Microprocessor 10 performs prefetching only in the case of sector replacements in one embodiment. During sector replacement, the required cache line is filled. If this required cache line is in the first half of the sector, the other cache line in the sector is prefetched. If this required cache line is in the second half of the sector, no prefetching is performed. It is noted that other prefetching methodologies may be employed in different embodiments of microprocessor 10.

When cache lines of instruction data are retrieved from external memory by bus interface unit 24, this data is conveyed to predecode logic block 12. In one embodiment, the instructions processed by microprocessor 10 and stored in cache 14 are variable-length (e.g., the x86 instruction set). Because decode of variable-length instructions is particularly complex, predecode logic 12 is configured to provide additional information to be stored in instruction cache 14 to aid during decode. In one embodiment, predecode logic 12 generates predecode bits for each byte in instruction cache 14 which indicate the number of bytes to the start of the next variable-length instruction. These predecode bits are stored in predecode cache 15 and are passed to decode unit 20 when instruction bytes are requested from cache 14.

Instruction cache 14 is implemented as a 32 Kbyte, two-way set associative, writeback cache in one embodiment of microprocessor 10. The cache line size is 32 bytes in this embodiment. Cache 14 also includes a TLB 16, which includes 64 entries used to translate linear addresses to physical addresses. Many other variations of instruction cache 14 and TLB 16 are possible in other embodiments.

Instruction fetch addresses are supplied by cache controller 18 to instruction cache 14. In one embodiment, up to 16 bytes per clock cycle may be fetched from cache 14. The fetched information is placed into an instruction buffer that feeds into decode unit 20. In one embodiment of microprocessor 10, fetching may occur along a single execution stream with seven outstanding branches taken.

In one embodiment, the instruction fetch logic within cache controller 18 is capable of retrieving any 16 contiguous instruction bytes within a 32-byte boundary of cache 14. There is no additional penalty when the 16 bytes cross a cache line boundary. Instructions are loaded into the instruction buffer as the current instructions are consumed by decode unit 20. (Predecode data from cache 15 is also loaded into the instruction buffer as well). Other configurations of cache controller 18 are possible in other embodiments.

Decode logic 20 is configured to decode multiple instructions per processor clock cycle. In one embodiment, decode unit 20 accepts instruction and predecode bytes from the instruction buffer (in x86 format), locates actual instruction boundaries, and generates corresponding "RISC ops". RISC ops are fixed-format internal instructions, most of which are executable by microprocessor 10 in a single clock cycle. RISC ops are combined to form every function of the x86 instruction set in one embodiment of microprocessor 10.

Microprocessor 10 uses a combination of decoders to convert x86 instructions into RISC ops. The hardware includes three sets of decoders: two parallel short decoders, one long decoder, and one vectoring decoder. The parallel short decoders translate the most commonly-used x86 instructions (moves, shifts, branches, etc.) into zero, one, or two RISC ops each. The short decoders only operate on x86 instructions that are up to seven bytes long. In addition, they are configured to decode up to two x86 instructions per clock cycle. The commonly-used x86 instructions which are greater than seven bytes long, as well as those semi-commonly-used instructions are up to seven bytes long, are handled by the long decoder.

The long decoder in decode unit 20 only performs one decode per clock cycle, and generates up to four RISC ops. All other translations (complex instructions, interrupts, etc.) are handled by a combination of the vector decoder and RISC op sequences fetched from an on-chip ROM. For complex operations, the vector decoder logic provides the first set of RISC ops and an initial address to a sequence of further RISC ops. The RISC ops fetched from the on-chip ROM are of the same type that are generated by the hardware decoders.

In one embodiment, decode unit 20 generates a group of four RISC ops each clock cycle. For clock cycles in which four RISC ops cannot be generated, decode unit 20 places RISC NOP operations in the remaining slots of the grouping. These groupings of RISC ops (and possible NOPs) are then conveyed to scheduler buffer 32.

It is noted that in another embodiment, an instruction format other than x86 may be stored in instruction cache 14 and subsequently decoded by decode unit 20.

Instruction control logic 34 contains the logic necessary to manage out-of-order execution of instructions stored in scheduler buffer 32. Instruction control logic 34 also manages data forwarding, register renaming, simultaneous issue and retirement of RISC ops, and speculative execution. In one embodiment, scheduler buffer 32 holds up to 24 RISC ops at one time, equating to a maximum of 12 x86 instructions. When possible, instruction control logic 34 may simultaneously issue (from buffer 32) a RISC op to any available one of execution units 36. In total, control logic 34 may issue up to six and retire up to four RISC ops per clock cycle in one embodiment.

In one embodiment, microprocessor 10 includes five execution units (36A–E). Store unit 36A and load unit 36B are two-staged pipelined designs. Store unit 36A performs data memory and register writes which are available for loading after one clock cycle. Load unit 36B performs memory reads. The data from these reads is available after two clock cycles. Load and store units are possible in other embodiments with varying latencies.

Execution unit 36C (Integer X unit) is a fixed point execution unit which is configured to operate on all ALU operations, as well as multiplies, divides (both signed and unsigned), shifts, and rotates. In contrast, execution unit 36D (Integer Y unit) is a fixed point execution unit which is configured to operate on the basic word and double word ALU operations (ADD, AND, CMP, etc.).

Execution units 36C and 36D are also configured to accelerate performance of software written using multimedia instructions. Applications that can take advantage of multimedia instructions include graphics, video and audio compression and decompression, speech recognition, and telephony. Units 36C–D are configured to execute multimedia instructions in a single clock cycle in one embodiment. Many of these instructions are designed to perform the same operation of multiple sets of data at once (vector processing). In one embodiment, unit 36C–D uses registers which are mapped on to the stack of floating point unit 36E.

Execution unit 36E contains an IEEE 734-compatible floating point unit designed to accelerate the performance of software which utilizes the x86 instruction set. Floating point software is typically written to manipulate numbers that are either very large or small, require a great deal of precision, or result from complex mathematical operations such as transcendentals. Floating point unit includes an adder unit, a multiplier unit, and a divide/square root unit. In one embodiment, these low-latency units are configured to execute floating point instructions in as few as two clock cycles.

Branch resolution unit 35 is separate from branch prediction logic 22 in that it resolves conditional branches such as JCC and LOOP after the branch condition has been evaluated. Branch resolution unit 35 allows efficient speculative execution, enabling microprocessor 10 to execute instructions beyond conditional branches before knowing whether the branch prediction was correct. As described above, microprocessor 10 is configured to handle up to seven outstanding branches in one embodiment.

Branch prediction logic 22, coupled to decode unit 20, is configured to increase the accuracy with which conditional branches are predicted in microprocessor 10. Ten to twenty percent of the instructions in typical applications include conditional branches. Branch prediction logic 22 is configured to handle this type of program behavior and its negative effects on instruction execution, such as stalls due to delayed instruction fetching. In one embodiment, branch prediction logic 22 includes an 8192-entry branch history table, a 16-entry by 16 byte branch target cache, and a 16-entry return address stack.

Branch prediction logic 22 implements a two-level adaptive history algorithm using the branch history table. This table stores executed branch information, predicts individual branches, and predicts behavior of groups of branches. In one embodiment, the branch history table does not store predicted target addresses in order to save space. These addresses are instead calculated on-the-fly during the decode stage.

To avoid a clock cycle penalty for a cache fetch when a branch is predicted taken, a branch target cache within branch logic 22 supplies the first 16 bytes at that address directly to the instruction buffer (if a hit occurs in the branch target cache). In one embodiment, this branch prediction logic achieves branch prediction rates of over 95%.

Branch logic 22 also includes special circuitry designed to optimize the CALL and RET instructions. This circuitry allows the address of the next instruction following the CALL instruction in memory to be pushed onto a return address stack. When microprocessor 10 encounters a RET instruction, branch logic 22 pops this address from the return stack and begins fetching.

Like instruction cache 14, L1 data cache 26 is also organized as two-way set associative 32 Kbyte storage. In one embodiment, data TLB 28 includes 128 entries used to translate linear to physical addresses. Like instruction cache 14, L1 data cache 26 is also sectored. Data cache 26 implements a MESI (modified-exclusive-shared-invalid) protocol to track cache line status, although other variations are also possible. In order to maximize cache hit rates, microprocessor 10 also includes on-chip L2 cache 40 within the memory sub-system.

Figure 2:
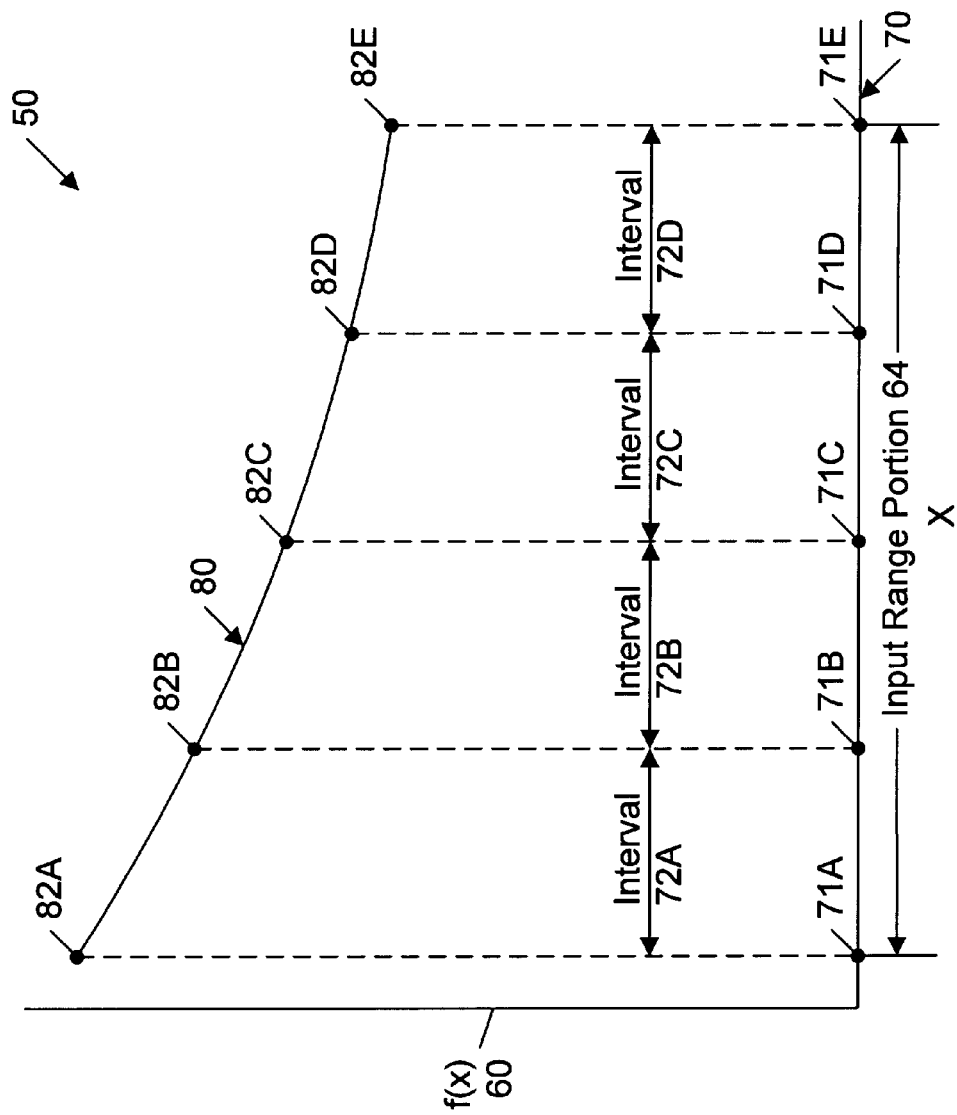
FIG. 2 is a graph depicting a portion of a function f(x) which is partitioned for use with a prior art naive look-up table.

Turning now to FIG. 2, a graph 50 of a function f(x) is depicted which corresponds to a prior art look-up table described below with reference to FIG. 3. Graph 50 includes a portion 80 of function f(x), with output values 82A–E plotted on a vertical axis 60 against corresponding input values on a horizontal axis 70.

As will be described below, a look-up table for function f(x) is designed by dividing a predetermined input range into one or more various sub-regions. A single value is generated for each of the one or more sub-regions, and then stored into the look-up table. When an input value is presented to the look-up table, an index is formed which corresponds to one of the sub-regions of the input range. This index is then usable to select one of the predetermined output values.

In FIG. 2, input range portion 64 corresponds to portion 80 of function f(x). As shown, input range 64 is divided into a plurality of intervals 72. Interval 72A, for example, corresponds to input values located between points 71A and 71B on the horizontal axis. Interval 72B corresponds to input values located between points 71B and 71C, etc. It is noted that while only four intervals are shown in graph 50, many intervals are typically computed for a given function. Only four are shown in FIG. 2 for simplicity.

As mentioned, each interval 72 has a corresponding range of output values. Interval 72A, for example, includes a range of output values spanning between points 82A and 82B. In order to construct a look-up table for function f(x), a single output value is selected for interval 72A which has a value between points 82A and 82B. The method of selecting this output value varies between look-up tables. The method used for selecting output values for various input sub-regions in one embodiment of the present invention is described in detail below.

Figure 3:
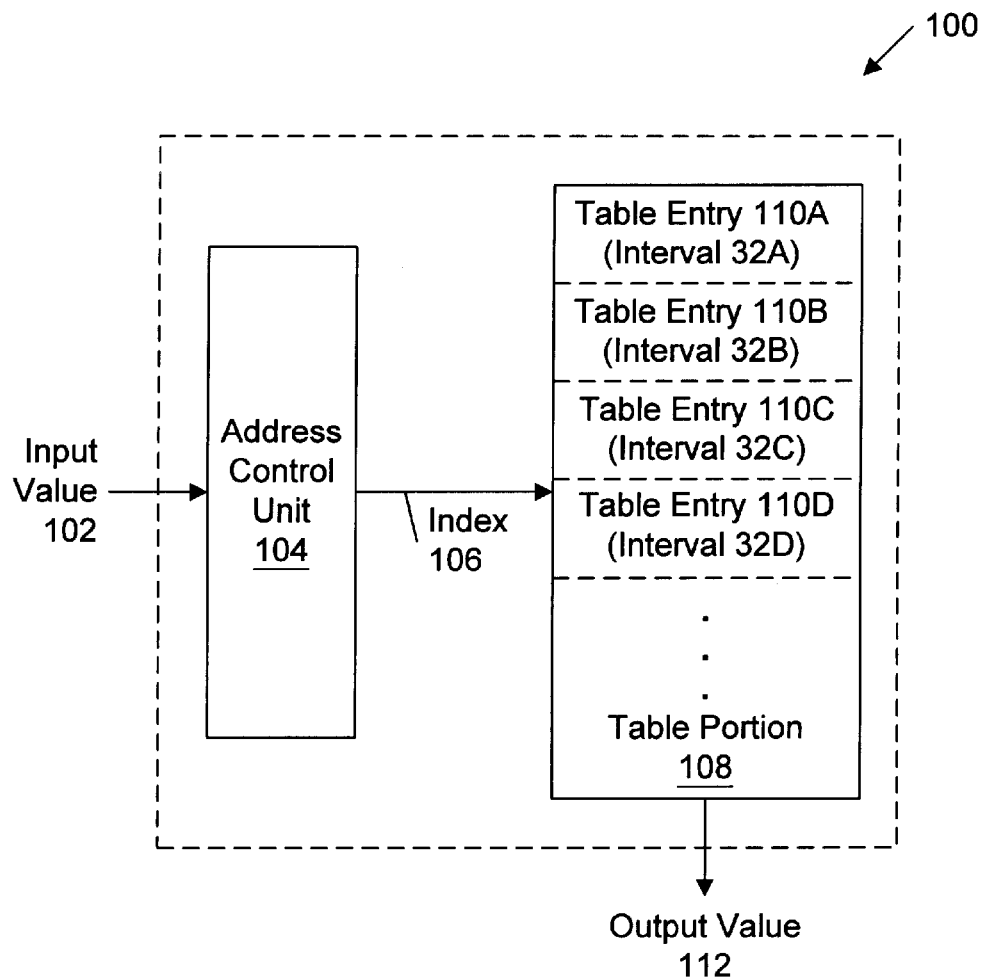
FIG. 3 is a prior art naive look-up table usable in conjunction with the function partitioned according to FIG. 1.

Turning now to FIG. 3, a block diagram of a prior art look-up table 100 is depicted. Look-up table 100 is configured to receive an input value 102 and generate an output value 112. Input value 102 is conveyed to an address control unit 104, which in turn generates an index 106 to a table portion 108. Table portion 108 includes a plurality of table entries 110. Index 106 selects one of table entries 110 to be conveyed as output value 112.

The implementation of look-up table 100 is advantageous for several reasons. First, index 106 is readily generated from input value 102. Typically, input value 102 is represented in binary format as a floating point number having a sign bit, a mantissa portion, and an exponent. Index 106, then, is formed by selecting a sufficient number of high-order mantissa bits to table portion 108, which usually includes a number of entries $2^m$, where m is some integer value. For example, if table portion 108 includes 64 entries, six highorder bits from the mantissa portion of input value 102 are usable as index 106. Another advantage of look-up table 100 is that output value 112 is usable as a output value of function f(x) without the additional step of interpolation (which is used in other look-up tables described below).

No interpolation is needed because input range portion 24 (and any additional range of input values) is divided into intervals for which a single output value is assigned. Each table entry 110 corresponds to one of these intervals as shown in FIG. 3. For example, table entry 110A corresponds to interval 32A, table entry 10B corresponds to interval 32B, etc. With this configuration, in order to increase the accuracy of output value 112, the number of intervals 32 are increased. This decreases the range of input values in each interval, and hence, the maximum possible error. Since a table entry 110 is provided for each interval 32, an increase in the number of intervals leads to a corresponding increase in table size. (Table size is equal to $P*2^{index}$ bits, where P is the number of bits per table entry, and $2^{index}$ is the number of table entries.) For many functions, in order to achieve the desired degree of accuracy, the input range is divided into a large number of intervals. Since there is a one-to-one correspondence between the number of intervals 32 and the number of table entries 110, achieving the desired degree of accuracy for many functions may lead to a prohibitively large look-up table.

Figure 4:
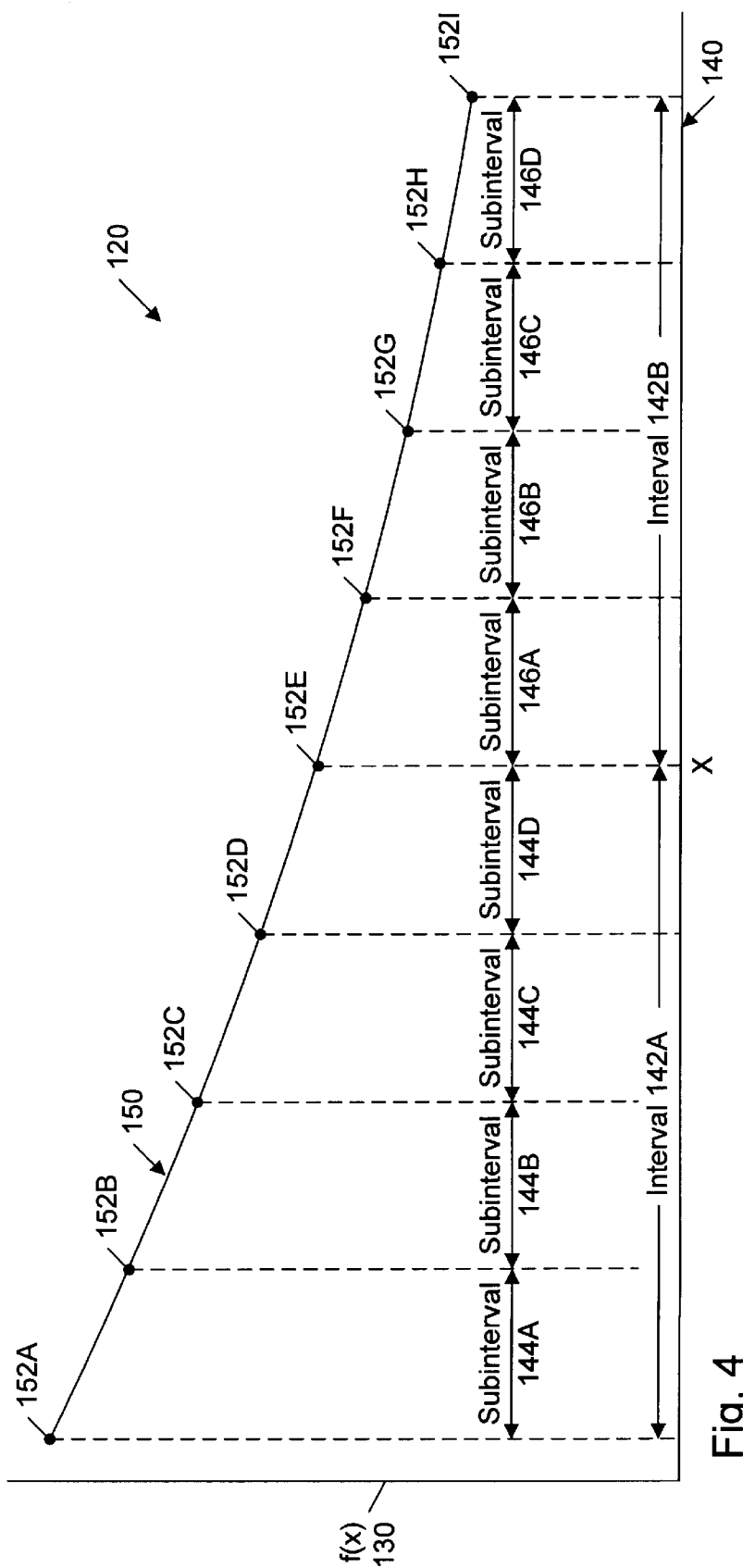
FIG. 4 is a graph depicting a portion of a function f(x) which is partitioned for use with a prior art bipartite look-up table.

Turning now to FIG. 4, a graph 120 is depicted of a portion 150 of function f(x). The partitioning of function portion 150 corresponds to a prior art look-up table described below with reference to FIG. 5. Graph 120 includes a portion 150 of function f(x), with output values 152A–E plotted on a vertical axis 130 against corresponding input values on a horizontal axis 140.

FIG. 4 illustrates a different input range partitioning for function f(x) than is shown in FIG. 2. This partitioning allows an interpolation scheme to be implemented for the look-up table described below with reference to FIG. 5. The input range of function f(x) is, as above, divided into intervals. Intervals 142A and 142B are shown in FIG. 4, although a given function may have any number of intervals depending upon the particular embodiment. Each interval 142 is then divided into subintervals. Interval 142A, for example, is divided into subintervals 144A–D, while interval 142B is divided into subintervals 146A–D.

With the input range of function f(x) partitioned as shown, a bipartite table look-up may thus be constructed which includes separate base and difference portions. The base portion of the bipartite look-up table includes an output value for each interval 142. The output value is located somewhere within the range of output values for the interval. For example, the output value selected for interval 142A is located between points 152A and 152E. Which subinterval 144 the base value for interval 142A is located in depends upon the particular embodiment.

The difference portion of the bipartite look-up table includes an output value difference for each subinterval. This output value difference may then be used (along with the base value for the interval) to compute an output of the bipartite look-up table. Typically, the output value difference is either added to the base value or subtracted from the base value in order to generate the final output.

For example, consider this method as applied to interval 142. First, an output value is chosen to represent each subinterval 144. Then, an output value is chosen for the entire interval 142A. In one embodiment, the chosen output value for interval 142A may be identical to one of the output values chosen to represent one of subintervals 144. The output value chosen to represent interval 142A is then used as the corresponding base portion value. The differences between this base portion value and the values chosen to represent each of subintervals 144 are used as the difference portion entries for interval 142A.

Figure 5:
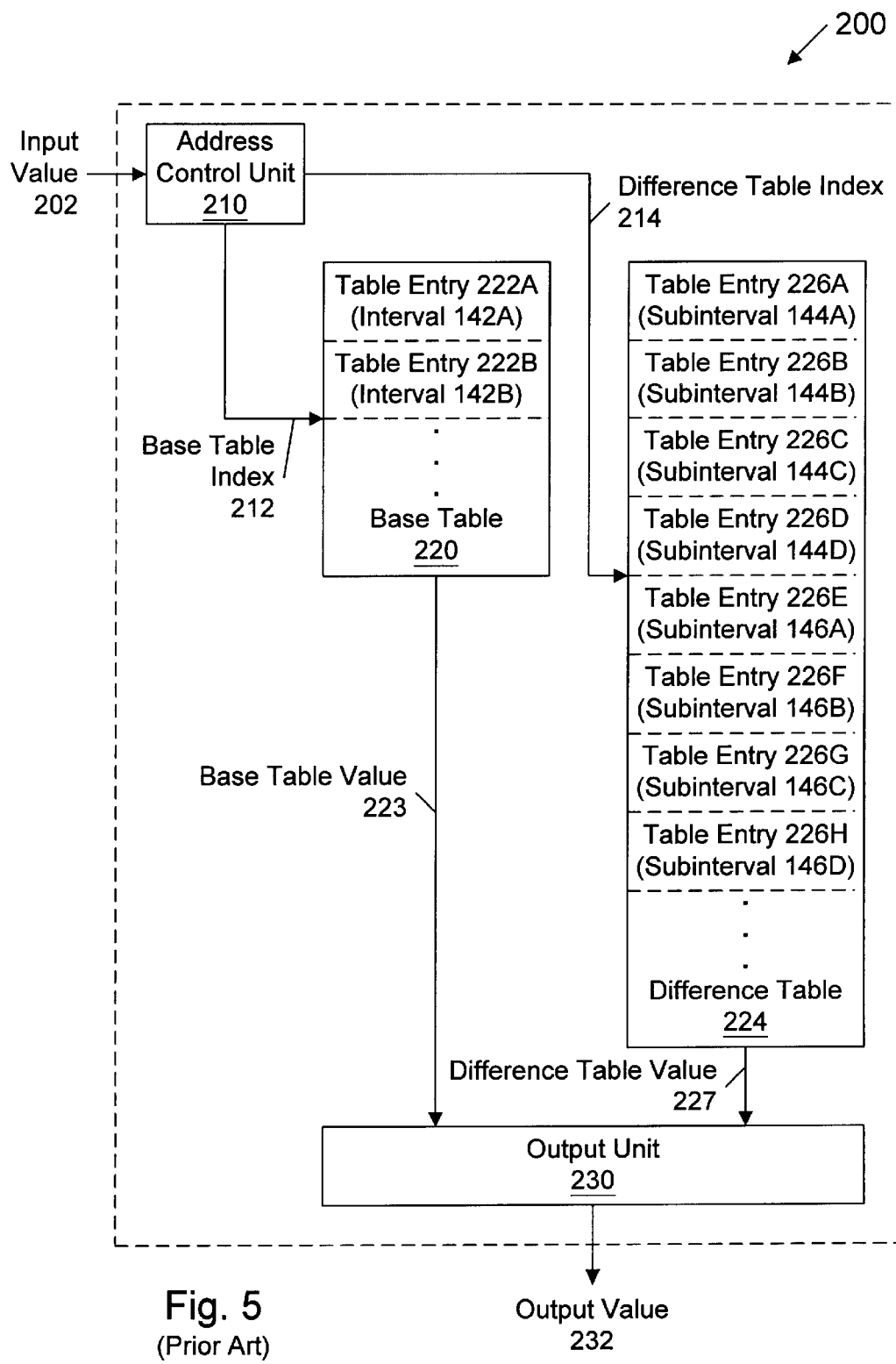
FIG. 5 is a prior art bipartite look-up table usable in conjunction with the function partitioned according to FIG. 4.

Turning now to FIG. 5, a block diagram of a prior art look-up table 200 is depicted. Look-up table 200 is configured to receive an input value 202 and generate an output value 232. Input value 202 is conveyed to an address control unit 210, which in turn generates a base table index 212 and a difference table index 214. Base table index 212 is conveyed to a base table 220, while difference table index 214 is conveyed to a difference table 224. Base table 220 includes a plurality of table entries 222. Base table index 212 selects one of entries 222 to be conveyed to an output unit 230 as a base table value 223. Similarly, difference table 224 includes a plurality of entries 226. Difference table index 214 selects one of entries 226 to be conveyed to output unit 230 as a difference table value 227. Output unit 230 then generates output value 232 in response to receiving base table value 223 and difference table value 227.

The indexing scheme of look-up table 200 is only slightly more complicated than that of look-up table 100. Similar to index 106, base table index 212 is formed by a number of high-order mantissa bits in the binary representation of input value 202. Like table portion 108, base table 220 includes an entry 222 for each interval 142 in the predetermined input range of function f(x). Typically there are $2^{index}$ entries, where index is the number of bits in base table index 212. The bits of index 212 plus an additional number of bits are used to form index 214. If the number of subintervals per interval, s, is a power of two, this number of additional bits is equal to $\log_2 s$. In general, the number of additional bits is sufficient to specify all subintervals per interval s.

This implementation may result in a savings of table storage for table 200 with respect to table 100. Consider intervals 32A–D of FIG. 2. In table 100, entries in table portion 108 each include P bits. Thus, the storage requirement for these four intervals is 4*P bits in a scheme in which no interpolation is utilized. With the intervals 32A–D partitioned as in FIG. 4, however, intervals 32A–D become a single interval having four subintervals. The storage requirements for this partitioning would be a single base table entry 222 of P bits (for the one interval) and four difference table entries 226 (one per subinterval) of Q bits each. For this example, then, the total storage requirement for this bipartite scheme is P+4*Q bits, where Q is the number of bits in each difference entry. If Q is sufficiently smaller than P, the bipartite implementation of table 200 results in a reduced storage requirement vis-a-vis table 100. This condition is typically satisfied when function f(x) changes slowly, such that few bits are required to represent the difference values of difference table 224. Note that the above example is only for a single interval of a given function. In typical embodiments of look-up tables, function input ranges are divided into a large number of input sub-regions, and table size savings is applicable over each of these sub-regions.

Figure 6:
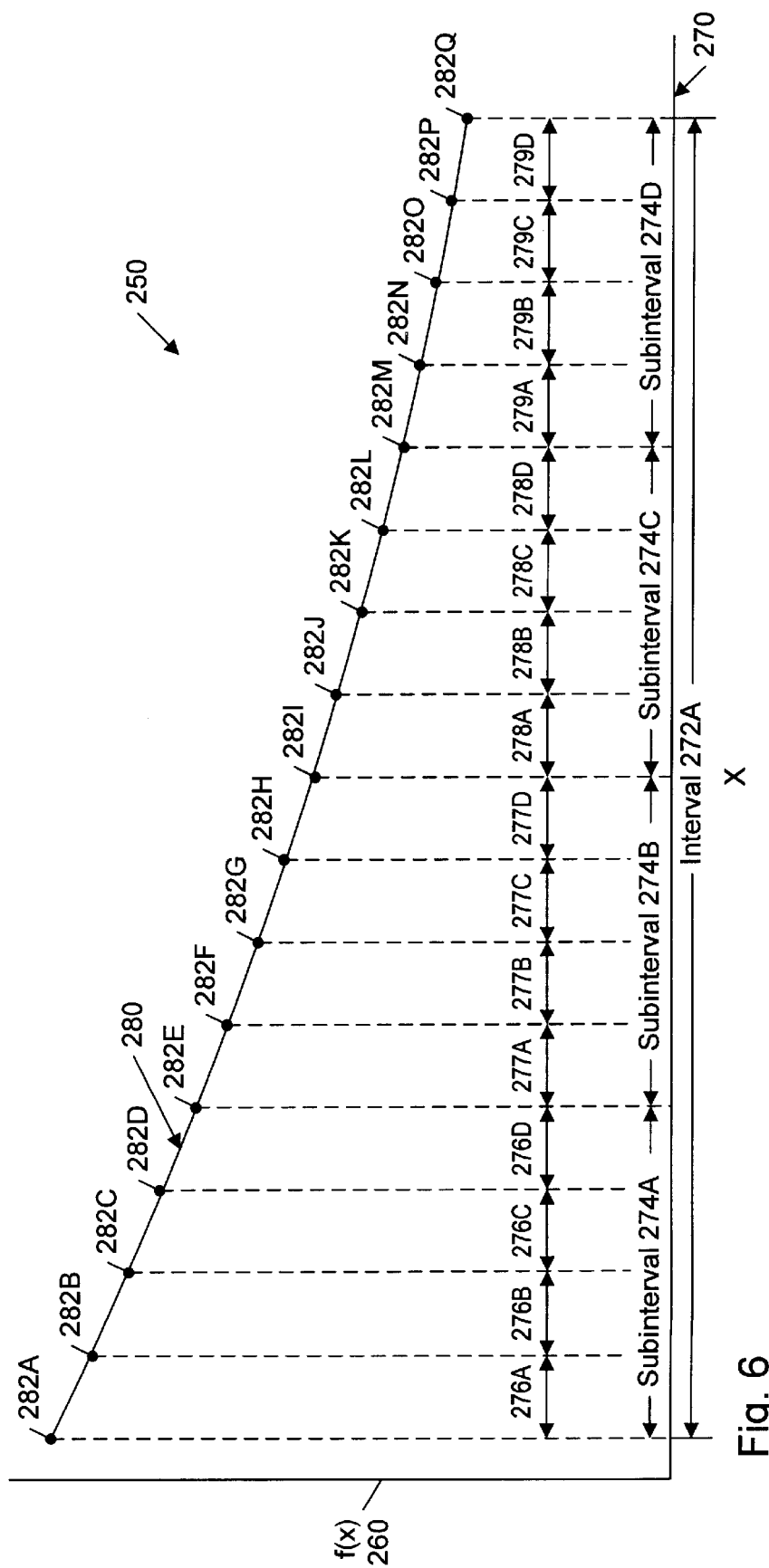
FIG. 6 is a graph depicting a portion of a function f(x) which is partitioned for use with a bipartite look-up table according to one embodiment of the present invention.

Turning now to FIG. 6, a graph 250 of a function f(x) is depicted which corresponds to a look-up table according to one embodiment of the present invention. This look-up table is described below with reference to FIG. 7. Graph 250 includes a portion 280 of function f(x), with output values 282A–Q plotted on a vertical axis 260 against corresponding input values x on a horizontal axis 270.

FIG. 6 depicts yet another partitioning of the range of inputs for function f(x). This partitioning allows an interpolation scheme to be implemented for the look-up table of FIG. 7 which allows further reduction in table storage from that offered by the configuration of table 200 in FIG. 5. The input range of function f(x) is, as above, divided into intervals. Only one interval, 272A, is shown in FIG. 6 for simplicity, although a given function may have any number of intervals, depending upon the embodiment. As shown, interval 272A is divided into a plurality of subintervals 274A–D. Additionally, each subinterval 274 is divided into a plurality of sub-subintervals. Subinterval 274A is divided into sub-subintervals 276A–D, subinterval 274B is divided into sub-subintervals 277A–D, etc.

With the partitioning shown in FIG. 6, a bipartite look-up table 300 may be constructed which is similar to table 200 shown in FIG. 5. Table 300 is described in detail below with reference to FIG. 7. Like table 200, table 300 includes a base table portion and a difference table portion. The entries of these tables, however, correspond to regions of the input range of function f(x) in a slightly different manner than the entries of table 200. The base table portion of table 300 includes an entry for each subinterval in the input range. Each base table entry includes a single output value to represent its corresponding subinterval. The base table entry for subinterval 274A, for example, is an output value between those represented by points 282A and 282E. Instead of including a separate difference table entry for each sub-subinterval in each subinterval, however, table 300 has a number of difference table entries for each interval equal to the number of sub-subintervals per subinterval. Each of these entries represents an averaging of difference values for a particular group of sub-subintervals within the interval.

Consider the partitioning shown in FIG. 6. An output value is determined for each subinterval 274, and each sub-subinterval 276–279. As will be described below, in one embodiment of the present invention, the output value for each subinterval and sub-subinterval is chosen such that maximum possible absolute error is minimized for each input region. The base table entries are computed by using the assigned output value for each of subintervals 274. A separate entry is entered for each of regions 274A–D. Then, difference values are computed for each sub-subinterval which are equal to the difference between the output value for the sub-subinterval and the output value assigned for the subinterval. Then, the difference values are averaged for sub-subintervals having common relative positions within the subintervals. These values are then used as the difference table entries.

For example, difference values are computed for each of sub-subintervals 276–279 and their respective subintervals. Then difference values for sub-subintervals 276A, 277A, 278A, and 279A are averaged to form the first difference entry for interval 272. Difference values for sub-subintervals 276B, 277B, 278B, and 279B are averaged to form the second difference entry, etc. This results in a number of difference entries per interval equal to the number of sub-subintervals per interval.

Like table 200, the base and difference table values may be combined to form a final output value. While the configuration of table 300 may result in a reduced table size, a slight increase in the number of bits in each table may be needed in order to achieve the same result accuracy as table 200.

Figure 7:
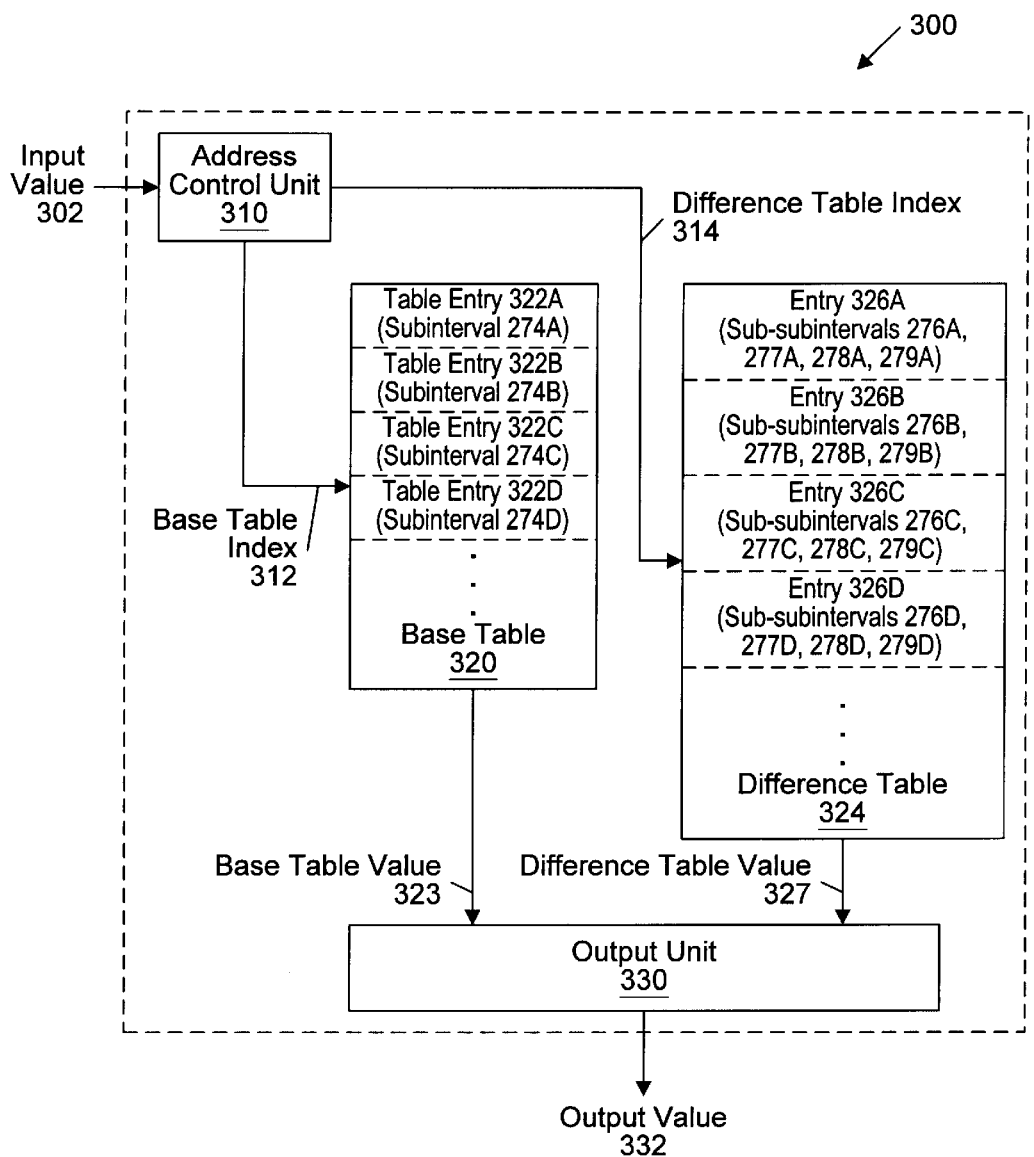
FIG. 7 is a bipartite look-up table usable in conjunction with the function partitioned according to FIG. 6.

Turning now to FIG. 7, a block diagram of look-up table 300 is depicted according to one embodiment of the present invention. Look-up table 300 is configured to receive an input value 302 and generate an output value 332. Input value 302 is conveyed to an address control unit 310, which in turn generates a base table index 312 and a difference table index 314. Base table index 312 is conveyed to a base table 320, while difference table index 314 is conveyed to a difference table 324. Base table 320 includes a plurality of table entries 322. Base table index 312 selects one of entries 322 to be conveyed to an output unit 330 as a base table value 323. Similarly, difference table 324 includes a plurality of entries 326. Difference table index 314 selects one of entries 326 to be conveyed to output unit 230 as difference table value 327. Output unit 330 then generates output value 332 in response to receiving base table value 323 and difference table value 327.

The indexing scheme of look-up table 300 is slightly different than that used to address table 200. In one embodiment, three groups of bits from a binary representation of input value 302 are used to generate indices 312 and 314. The first group includes a number of high-order mantissa bits sufficient to uniquely specify each interval of the input range of function f(x). For example, the first group includes four bits if the input range of function f(x) is divided into 16 intervals. Similarly, the second bit group from the binary representation of input value 302 has a number of bits sufficient to uniquely specify each subinterval included within a given interval. For example, if each interval includes four subintervals (such as is shown in FIG. 6), the second bit group includes two bits. Finally, the third bit group includes a number of bits sufficient to uniquely identify each group of sub-subintervals within a given interval. In this context, a group of sub-subintervals includes one sub-subinterval/subinterval, with each sub-subinterval in the group having the same relative position within its respective subinterval. The third bit group thus includes a number sufficient to specify the number of sub-subintervals in each subinterval. For the partitioning shown in FIG. 6, two bits are needed in the third bit group in order to specify each group of sub-subintervals. This addressing scheme is described in greater detail below.

Because base table 320 includes an entry for each sub-interval in the input range of function f(x), base table index 312 includes the first and second bit groups described above from the binary representation of input value 302. Base table index 312 is thus able to select one of entries 322, since the first bit group effectively selects an input interval, and the second bit group selects a subinterval within the chosen interval. As shown in FIG. 7, each of table entries 322A–D corresponds to a different subinterval 274 within interval 272A.

Difference table 324 includes a set of entries for each interval equal to the number of sub-subintervals per sub-interval. As shown, difference table 324 includes four entries 326 for interval 272A. Entry 326A corresponds to sub-subintervals 276A, 277A, 278A, and 279A, and includes an average of the actual difference values of each of these sub-subintervals. Difference table index 314 thus includes the first and third bit groups described above from the binary representation of input value 302. The first bit group within index 314 effectively selects an interval within the input range of function f(x), while the third bit group selects a relative position of a sub-subinterval within its corresponding subinterval.

The configuration of table 300 may result in a savings in table storage size with respect to tables 100 and 200. Consider the partitioning of function portion 280 shown in graph 250. Function portion 280 is divided into 16 equal input regions (called "sub-subintervals" with reference to FIG. 7).

In the configuration of table 100, the 16 input regions of FIG. 6 correspond to intervals. Each of the 16 intervals has a corresponding entry of P bits in table portion 108. Thus, the partitioning of FIG. 6 results in a table size of 16*P bits for the configuration of table 100.

By contrast, in the configuration of table 200, the 16 input regions in FIG. 6 would represent intervals divided into subintervals. In one embodiment, the 16 input regions are divided into four intervals of four subintervals each. Each interval has a corresponding entry of P bits in base table 220, while each of the 16 subintervals has a difference entry of Q bits in difference table 224. For this partitioning, then, the table storage size of table 200 is 4*P+16*Q bits. The configuration of table 200 thus represents a storage savings over table 100 if function f(x) changes slowly enough (Q is greater for functions with steeper slopes, since larger changes are to be represented).

The configuration of table 300 represents even greater potential storage savings with respect to tables 100 and 200. As shown in FIG. 7, function portion 280 includes an interval 272A divided into four subintervals 274. Each subinterval 274 is divided into sub-subintervals, for a total of 16 input regions. Each subinterval has a corresponding entry of P' bits in base table 320 (P' is potentially slightly larger than P in order to achieve the same degree of accuracy). For interval 272A, difference table 224 has four entries of Q' bits each (Q' is potentially slightly larger than Q since averaging is used to compute the difference values). The total table storage requirement for table 300 is thus 4*P'+4*Q' bits. Depending on the slope of function f(x), this represents a potential savings over both tables 100 and 200. The configuration of table 300 is well-suited for large, high-precision tables.

Figure 8:
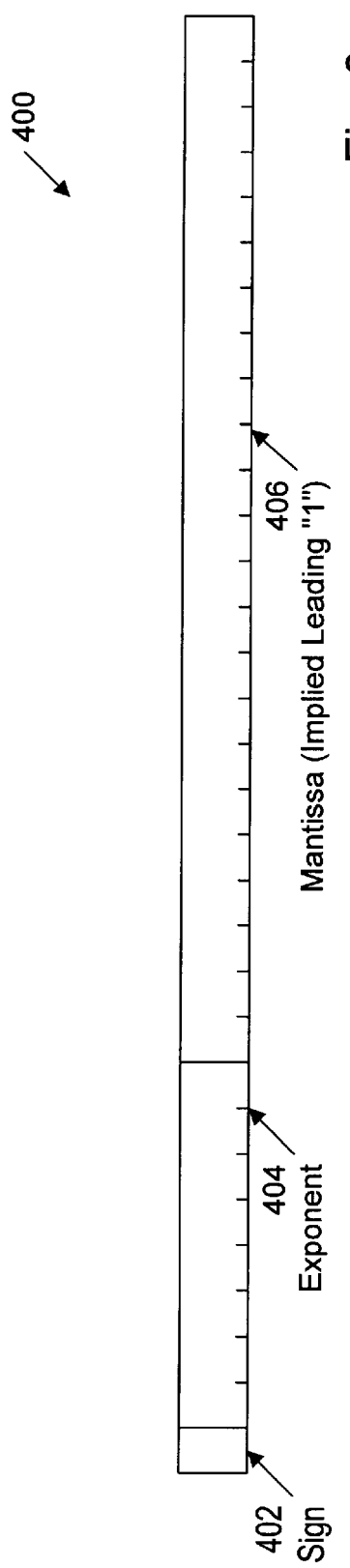
FIG. 8 depicts one format for an input value to a bipartite look-up in accordance with one embodiment of the present invention.

Turning now to FIG. 8, a format 400 for input values used in one embodiment of the invention is illustrated. Generally speaking, look-up tables according to the present invention are compatible with any binary floating-point format. Format 400 (the IEEE single-precision floating-point format) is one such format, and is used below in order to illustrate various aspects of one embodiment of the invention.

Format 400 includes a sign bit 402, an 8-bit exponent portion 404, and a 23-bit mantissa portion 406. The value of sign bit 402 indicates whether the number is positive or negative, while the value of exponent portion 404 includes a value which is a function of the "true" exponent. (One common example is a bias value added to the true exponent such that all exponent 404 values are greater than or equal to zero). Mantissa portion 406 includes a 23-bit fractional quantity. If all table inputs are normalized, values represented in format 400 implicitly include a leading "1" bit. A value represented by format 400 may thus be expressed as $$x = (-1)^s \cdot 2^{expo} \cdot mant, \quad (1)$$

where s represents the value sign bit 402, expo represents the true exponent value of the floating point number (as opposed to the biased exponent value found in portion 404), and mant represents the value of mantissa portion 406 (including the leading one bit).

An important floating-point operation, particularly for 3-D graphics applications, is the reciprocal function (1/x), which is commonly used during the perspective division step of the graphics pipeline. The reciprocal function may be generally expressed as follows:

$$\frac{1}{x} = \frac{1}{(-1)^s \cdot 2^{expo} \cdot mant}, \text{ or} \quad (2)$$

$$\frac{1}{x} = \frac{1}{(-1)^s} \cdot \frac{1}{2^{expo}} \cdot \frac{1}{mant}, \quad (3)$$

which simplifies to $$\frac{1}{x} = (-1)^s \cdot 2^{-expo} \cdot \frac{1}{mant} \text{ or} \quad (4a)$$

$$\frac{1}{x} = (-1)^s \cdot 2^{-1-expo} \cdot \frac{2}{mant}. \quad (4b)$$

Since the reciprocal of mant is clearly the difficult part of the operation, it is advantageous to implement an approximation to this value using table look-up. Since table input values (e.g., input value 302) are normalized, mant is restricted to $$2^N \le mant < 2^{N+1} \quad (5)$$

for some fixed N. In order to compute the reciprocal of all floating-point numbers, then, it suffices to compute 1/mant over the primary range $[2^N, 2^{N+1})$, and map all other inputs to that range by appropriate exponent manipulation (which may be performed in parallel with the table look-up).

Another common graphics operation is the reciprocal square root operation ($x^{-\frac{1}{2}}$), used in distance and normalization calculations. Defining sqrt(−x)=−sqrt(x) in order to handle negative inputs, this function may be expressed as follows:

$$\frac{1}{\sqrt{x}} = \frac{1}{\sqrt{(-1)^s \cdot 2^{expo} \cdot mant}}, \text{ or} \quad (6)$$

$$\frac{1}{\sqrt{x}} = \frac{1}{\sqrt{(-1)^s}} \cdot \frac{1}{\sqrt{2^{expo}}} \cdot \frac{1}{\sqrt{mant}}, \quad (7)$$

which simplifies to $$\frac{1}{\sqrt{x}} = (-1)^s \cdot 2^{-\left(\frac{expo}{2}\right)} \cdot \frac{1}{\sqrt{mant}}. \quad (8)$$

Because having the exponent of 2 be a whole number in equation (8) is desirable, the reciprocal square root function may be written as two separate equations, depending upon whether expo is odd or even. These equations are as follows:

$$\frac{1}{\sqrt{x}} = (-1)^s \cdot 2^{-\left(\frac{expo}{2}\right)} \cdot \frac{1}{\sqrt{mant}} (expo \text{ even}), \text{ and} \quad (9)$$

$$\frac{1}{\sqrt{x}} = (-1)s \cdot 2^{-\left(\frac{expo-1}{2}\right)} \cdot \frac{1}{\sqrt{2 \cdot mant}} (expo \text{ odd}). \quad (10)$$

As with the reciprocal function, the difficult part of the reciprocal square root function is the computation of 1/sqrt (mant) or 1/sqrt(2*mant). Again, this is implemented as a table look-up function. From equations (9) and (10), it can be seen that in one embodiment of a look-up table for the reciprocal square root function, the look-up table inputs may span two consecutive binades in order to handle both odd and even exponents. For true exponent values that are even, then, the input range is $[2^N, 2^{N+1})$, with odd true exponent values occupying the next binade, $[2^{N+1}, 2^{N+2})$.

It is noted that the order of the binades may be reversed for a look-up table that receives biased exponent values with a format that has an odd bias value. Thus, the lower half of a look-up table for the reciprocal square root function may contain entries for the binade defined by [2,4), while the upper order addresses include entries for the binade [1,2). Alternatively, the least significant bit of the biased exponent value may be inverted so that binade [1,2) entries are in the lower half of the look-up table.

For any binary floating-point format (such as format 400), a table look-up mechanism may be constructed for the reciprocal and reciprocal square root functions by extracting some number IDX of high-order bits of mantissa portion 406 of the input value. The look-up table includes P bits for each entry, for a total size (in a naïve implementation) of $P*2^{IDX}$ bits. The computation of the output sign bit and the output exponent portion are typically computed separately from the table look-up operation and are appropriately combined with the table output to generate the output value (be it a reciprocal or a reciprocal square root). Note that since the numeric value of each mantissa bit is fixed for a given binade, extracting high-order bits automatically ensures equidistant nodes over the binade, such that interpolation may be performed easily.

As described above, the table look-up mechanism for the reciprocal square root has input values ranging over two consecutive binades. If it is desired to have equidistant nodes across both binades, IDX high-order bits may extracted from mantissa value 406 for the lower binade, with IDX+1 bits extracted from value 406 for the upper binade (this is done since the numeric value of each fractional bit in the upper binade is twice that of the same bit in the lower binade). In this implementation, the reciprocal square root function has a storage size of $P*2^{IDX}+P*2^{IDX+1}=3*P*2^{IDX}$ bits. In one embodiment, the required table accuracy allows table size to be reduced to $2*P*2^{IDX}=P*2^{IDX+1}$ bits by always extracting IDX leading fractional mantissa bits for each binade. This results in reducing the distance between the nodes in the upper binade. For the reciprocal square root function (1/sqrt (x)), the slope decreases rapidly for increasing x, which offsets table quantization error in the upper binade. Thus, nodes in a given binade (either upper or lower) are equidistant, but the distance between nodes varies in adjacent binades by a factor of two.

In one embodiment, performing table look-up for the reciprocal square root function may be accomplished by making one table for each of the two binades and multiplexing their output based upon the least significant bit of the value of exponent portion 404. In another embodiment, a single table may be implemented. This single table is addressed such that the IDX leading fractional bits of mantissa value 406 constitute bits <(IDX-1):0> of the address, with the least significant bit of exponent value 404 bit <IDX> of the table address. Such a table is discussed in greater detail below.

Figure 9A:
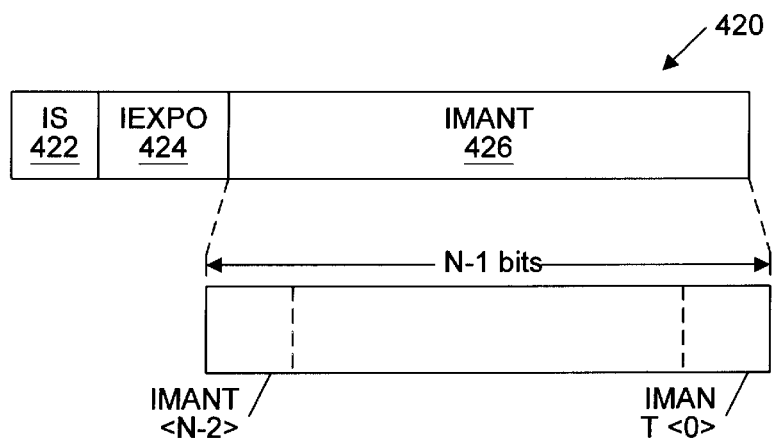
FIG. 9A illustrates a look-up table input value according to the format of FIG. 8 in one embodiment of the present invention.

Turning now to FIG. 9A, a look-up table input value 420 according to format 400 is depicted. Input value 420 includes a sign bit (IS) 422, an exponent value (IEXPO) 424, and a mantissa value (IMANT) 426. In the embodiment shown, input value 420 is normalized, and mantissa value 426 does not include the leading one bit. Accordingly mantissa value 426 is shown as having N−1 bits (mantissa value 426 would be shown as having N bits in an embodiment in which the leading one bit is stored explicitly). The most significant bit in mantissa value 426 is represented in FIG. 9A as IMANT<N−2>, while the least significant bit is shown as IMANT<0>.

Figure 9B:
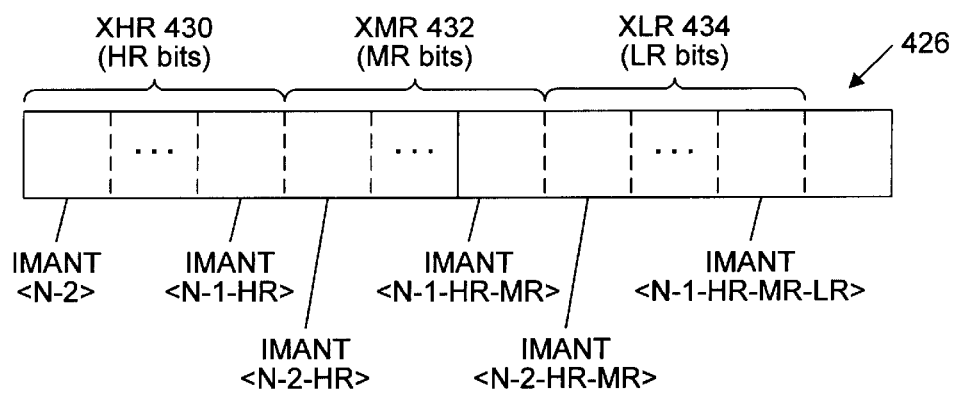
FIG. 9B depicts the mantissa portion of a look-up table input value for the reciprocal function.

Turning now to FIG. 9B, an exploded view of mantissa value 426 is shown according to one embodiment of the present invention. In one embodiment, the bits of mantissa value 426 may be grouped according to the scheme shown in FIG. 9B in order to index into base and difference table portions of a look-up table for the reciprocal function. Other bit grouping are possible in alternate embodiments of the present invention.

The first group of bits is XHR 430, which is HR consecutive bits from IMANT<N−2> to IMANT<N−2−HR>. Similarly, the second group of bits is XMR 432, which includes MR consecutive bits from position IMANT<N−2−HR> to IMANT<N−1−HR−MR>, while the third group of bits, XLR 434, includes LR consecutive bits from IMANT<N−2−HR−MR> to IMANT<N−2−HR−MR−LR>. As will be described below, XHR 430 is used to specify the interval in the input range which includes the input value. Likewise, XMR 432 identifies the subinterval, and XLR the sub-subinterval group.

In one embodiment, the input value range for the reciprocal function for which look-up values are computed is divided into a plurality of intervals, each having a plurality of subintervals that are each divided into a plurality of sub-subintervals. Accordingly, XHR 430, XMR 432, and XLR 434 may each be as short as one bit in length (although the representation in FIG. 9B shows that each bit group includes at least two bits). Because each of these quantities occupies at least one bit in mantissa value 426, none of bit groups 430, 432, and 434 may be more than N−3 bits in length.

Figure 9C:
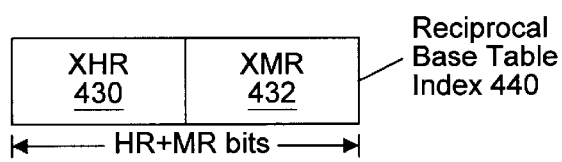
FIG. 9C depicts a base table index for a bipartite look-up table for the reciprocal function, according to one embodiment of the present invention.

Turning now to FIG. 9C, a reciprocal base table index 440 is shown. As depicted, index 440 is composed of bit group XHR 430 concatenated with bit group XMR 432. As will be described below, index 440 is usable to select a base entry in a bipartite look-up table according to one embodiment of the present invention. In one embodiment, XHR 430 includes sufficient bits to specify each interval in the input range, while XMR 432 includes sufficient bits to specify each subinterval within a given interval. Accordingly, index 440 is usable to address a base table portion which includes an entry for each subinterval of each interval.

Figure 9D:
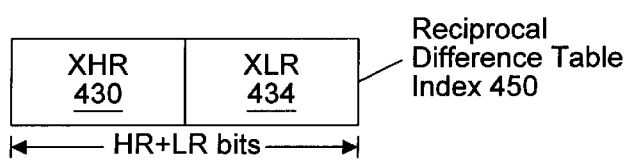
FIG. 9D depicts a difference table index for a bipartite look-up table for the reciprocal function, according to one embodiment of the present invention.

Turning now to FIG. 9D, a reciprocal difference table index 450 is shown. As depicted, index 450 is composed of bit group XHR 430 concatenated with bit group XLR 434. As will be described below, index 450 is usable to select a difference entry in a bipartite look-up table according to one embodiment of the present invention. As described above, XHR 430 includes sufficient bits to specify each interval in the input range, while XLR 432 includes sufficient bits to specify a group of sub-subintervals within a given interval. (As stated above, each group of sub-subintervals includes one sub-subinterval per subinterval, each sub-subinterval having the same relative position within its respective subinterval). Accordingly, index 450 is usable to address a difference table portion which includes an entry for each sub-subinterval group of each interval.

Figure 10A:
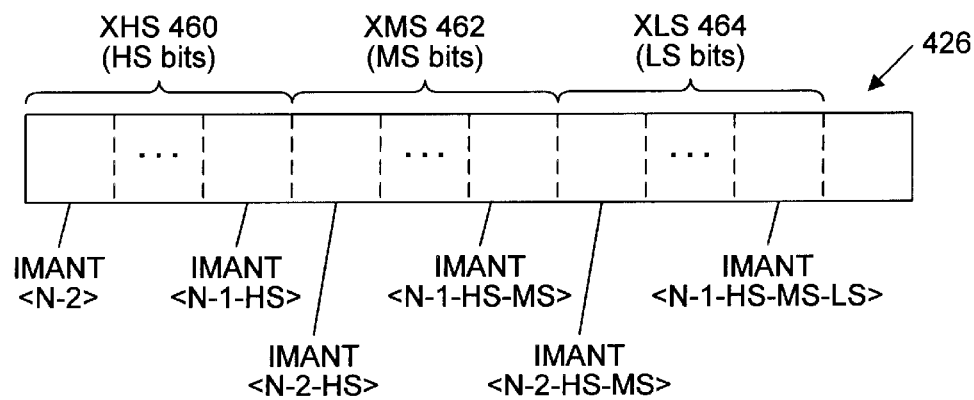
FIG. 10A depicts the mantissa portion of a look-up table input value for the reciprocal square root function.

Turning now to FIG. 10A, mantissa value 426 is shown with different groupings of bits. Mantissa value 426 is partitioned in this manner when input value 420 corresponds to a second function, the reciprocal square root. The base and difference indices generated from the bit groupings of FIG. 10A are usable to obtain base and difference values for the reciprocal square root function within a bipartite look-up table according to one embodiment of the present invention.

Like the groupings of FIG. 9B, mantissa value 426 includes a first bit group XHS 460 which includes HS bits. This first group is followed by a second bit group XMS 462, having MS bits, and a third bit group XLS 464, with LS bits. In one embodiment, groups 460, 462, and 464 have the same length restrictions as groups 430, 432, and 434.

FIG. 10A is illustrative of the fact that the indices for each function in a multi-function bipartite look-up table do not have to be identical. Instead, the indices may be adjusted according to how the individual input ranges for the different functions are partitioned. For example, in one embodiment, a bipartite look-up table may include base and difference values for a first and second function. If greater accuracy is required for the second function in comparison to the first function, the input range of the second function may be partitioned differently than that of the first (the second function input range may be divided into more intervals, subintervals, etc.). Accordingly, this leads to more bits in the base and difference table indices for the second function. As will be shown below, however, it is often advantageous for the base and difference table indices to be identical in length (HR=HS, MR=MS, and LR=LS).

Figure 10B:
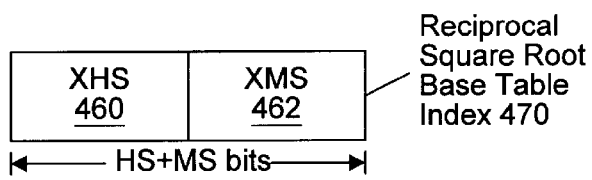
FIG. 10B depicts a base table index for a bipartite look-up table for the reciprocal square root function, according to one embodiment of the present invention.
Figure 10C:
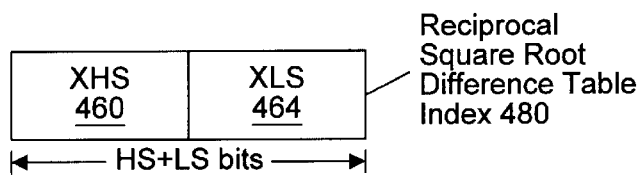
FIG. 10C depicts a difference table index for a bipartite look-up table for the reciprocal square root function, according to one embodiment of the present invention.

Turning now to FIG. 10B, a reciprocal square root base table index 470 is depicted. Similarly, FIG. 10C depicts a reciprocal square root difference table index 480. Both indices 470 and 480 are formed from the bit groups shown in FIG. 10A, and usable in a similar manner to indices 440 and 450 shown in FIGS. 8C and 8D.

Figure 11:
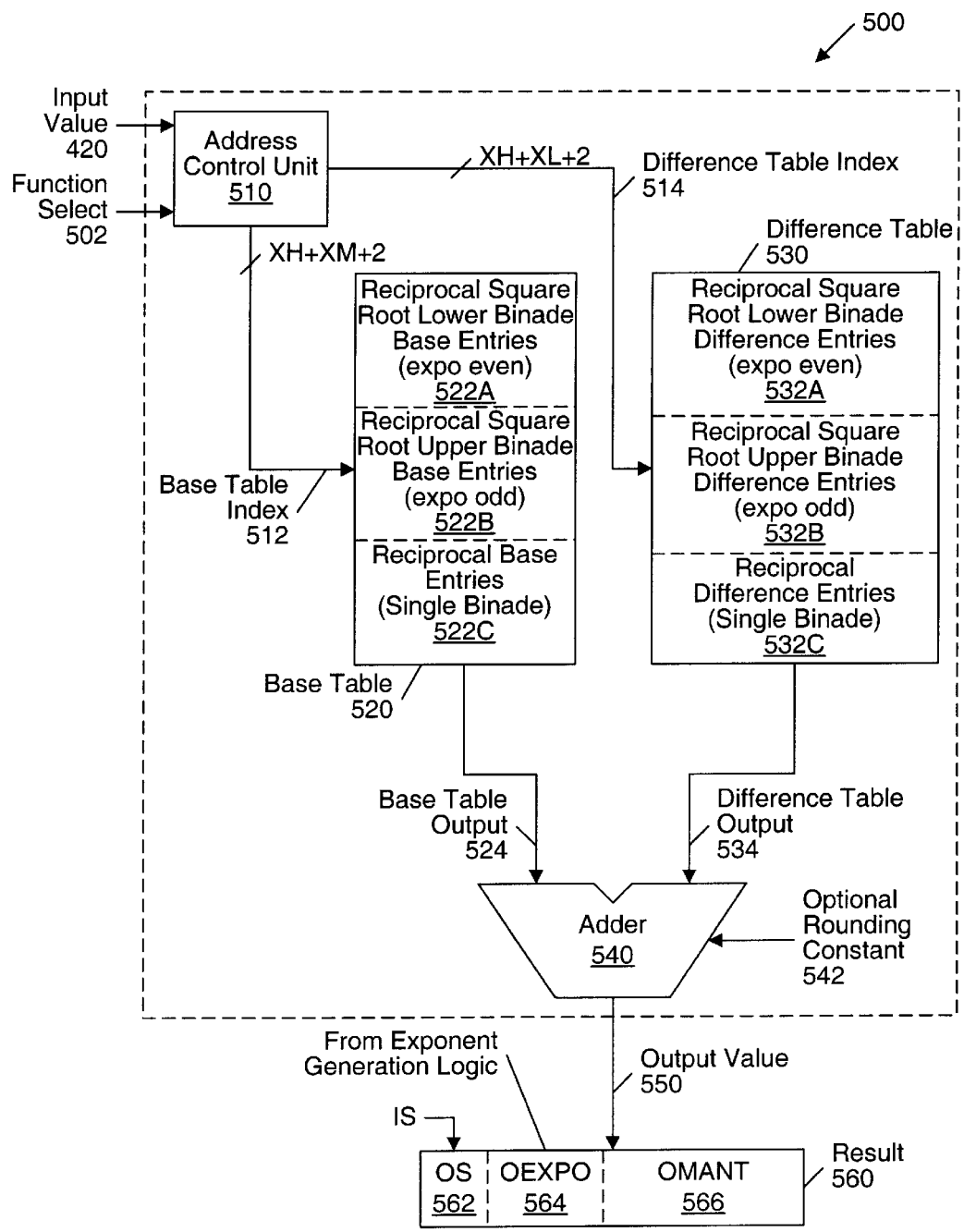
FIG. 11 is a bipartite look-up table for the reciprocal and reciprocal square root functions according to one embodiment of the present invention.

Turning now to FIG. 11, a block diagram of a multi-function bipartite look-up table 500 is shown according to one embodiment of the present invention. Look-up table 500 receives input value 420 (depicted above in FIG. 9A) and a function select signal 502, and generates an output value 550 as a result of the table look-up operation. Input value 420 and function select signal 502 are conveyed to an address control unit 510, which in turn generates a base table index 512 and a difference table index 514. Base table index 512 is conveyed to base table 520, which, in one embodiment, includes base output values for both the reciprocal function and the reciprocal square root function. Similarly, difference table index 514 is conveyed to difference table 530. Difference table 530 may also, in one embodiment, include difference output values for both the reciprocal and reciprocal square root functions.

In the embodiment shown in FIG. 11, base table 520 includes output base values for the reciprocal square root function over an input range of two binades. These base values are stored within locations in base table regions 522A and 522B. Table 520 further includes base output values for the reciprocal function over a single binade in entries within base table region 522C. Each region 522 includes a number of entries equal to the number of intervals in the allowable input range times the number of subintervals/interval.

Difference table 530, on the other hand, is configured similarly to base table 520, only it includes output difference values for the two functions. Like table 520, table 530 includes difference values over two binades for the reciprocal square root function (within entries in difference table regions 532A and 532B), and over a single binade for the reciprocal function (within entries in region 532C). Each of regions 532 includes a number of entries equal to the number of intervals in the input range times the number of sub-subintervals/subinterval.

Ultimately, base table index 512 and difference table index 514 select entries from base table 520 and difference table 530, respectively. The output of base table 520, base table output 524, is conveyed to an adder 540, which also receives difference table output 534, selected from difference table 530 by difference table index 514. Adder 540 also receives an optional rounding constant 542 as a third addend. If rounding is not needed, constant 542 is zero. Adder 540 adds quantities 524, 534, and 542, generating output value 550.

As described above, an efficient indexing implementation may be achieved by partitioning the input range identically for each function provided by look-up table 500. This allows the entries for both functions within tables 520 and 530 to each be addressed by a single index, even though each table includes values for two functions. In the embodiment shown in FIG. 11, the input range for the two functions (reciprocal and reciprocal square root) are partitioned such that a single index is generated per table portion. As will be shown in FIG. 12, the number of index bits is equal to the number of bits necessary to select a table region 522/532, plus the number of bits needed to select an entry within the chosen table region (the number of entries in each storage region for tables 520 and 530 is described above).

In one embodiment, each of the entries in base table 520 is P bits (P>1). Each entry in difference table 530 is Q bits, where Q is less than P. As described above, the ratio of P to Q depends upon the slope of the function being represented. In general, where I is the number of intervals in a predetermined input range and J is the number of subintervals/interval, Q is related to P by the relationship Q=P−(I+J)+c, where c is a constant which depends upon the slope of the function (specifically the largest slope in magnitude that occurs in the primary input interval).

For example, for the reciprocal function, c=1 since the maximum slope in interval [1,2) is 1 (at x=1). Similarly, for the reciprocal square root function, c=0, since the maximum slope in [1,4) is 0.5 (at x=1). Generally speaking, a function with a relatively high slope requires more bits in the difference entry to represent change from a corresponding base value. In one embodiment, for example, both the reciprocal and reciprocal square root functions have slopes which allow Q to be less than 0.5*P, while still maintaining a high degree of accuracy.

Adder 540 is configured to be an R-bit adder, where R is sufficient to represent the maximum value in base table 520 (R may be equal to P in one embodiment). Adder 540 is configured to add table outputs 524 and 534, plus optional rounding constant 542, such that the least significant bits of the addends are aligned. This add operation results in an output value 550 being produced. In one embodiment, the use of optional rounding constant 542 results in a number of least significant bits being discarded from output value 550.

In the embodiment shown in FIG. 11, adder 540 does not generate a carry out signal (a carry out signifies that output value 550 exceeds $2^R$). Since all the entries of tables 520 and 530 have been determined before table 500 is to be used (during operation of a microprocessor in one embodiment), it may be determined if any of the possible combinations of base/difference entries (plus the rounding constant) result in an output value 550 which necessitates providing a carry out signal.

As shown, result 560 for the two functions of table 500 includes an output sign bit portion 562, an output exponent portion 564, and an output mantissa portion 566. Output value 550 is usable as mantissa portion 566, although some bits may be discarded from output value 550 in writing output mantissa portion 566. With regard to the value of output sign bit portion 562, the value of input sign portion 422 is usable as the value of portion 562 for both the reciprocal and reciprocal square root functions. The value of output exponent portion 564 is generated from the value of input exponent portion 422 of input value 420, and is calculated differently for the reciprocal function than it is for the reciprocal square root function.

In one embodiment, the true input exponent, TIEXPO, is related to the value of field 424 in input value 420, IEXPO.

Similarly, the true output exponent, TOEXPO, is related to the value to be written to field 564, OEXPO. The value written to OEXPO is dependent upon the particular function being evaluated.

For the reciprocal function, the value written to OEXPO is computed such that TOEXPO=−1−TIEXPO[+CR], where [+CR] is part of the equation if carry out generation is applicable. For the common case in which IEXPO=TIEXPO+BIAS and OEXPO=TOEXPO+BIAS, it follows that OEXPO=2*BIAS−1−EXPO[+CR].

For the reciprocal square root function, OEXPO is computed such that TOEXPO=(−1−(TIEXPO/2))[+CR] if TIEXPO is greater than or equal to zero. Conversely, if TIEXPO is less than zero, OEXPO is computed such that TOEXPO=(−(TIEXPO+½))[+CR]. For the common case in which IEXPO=TIEXPO+BIAS and OEXPO=TOEXPO+BIAS, OEXPO=((3*BIAS −1−IEXPO)>>1)[+CR].

Figure 12:
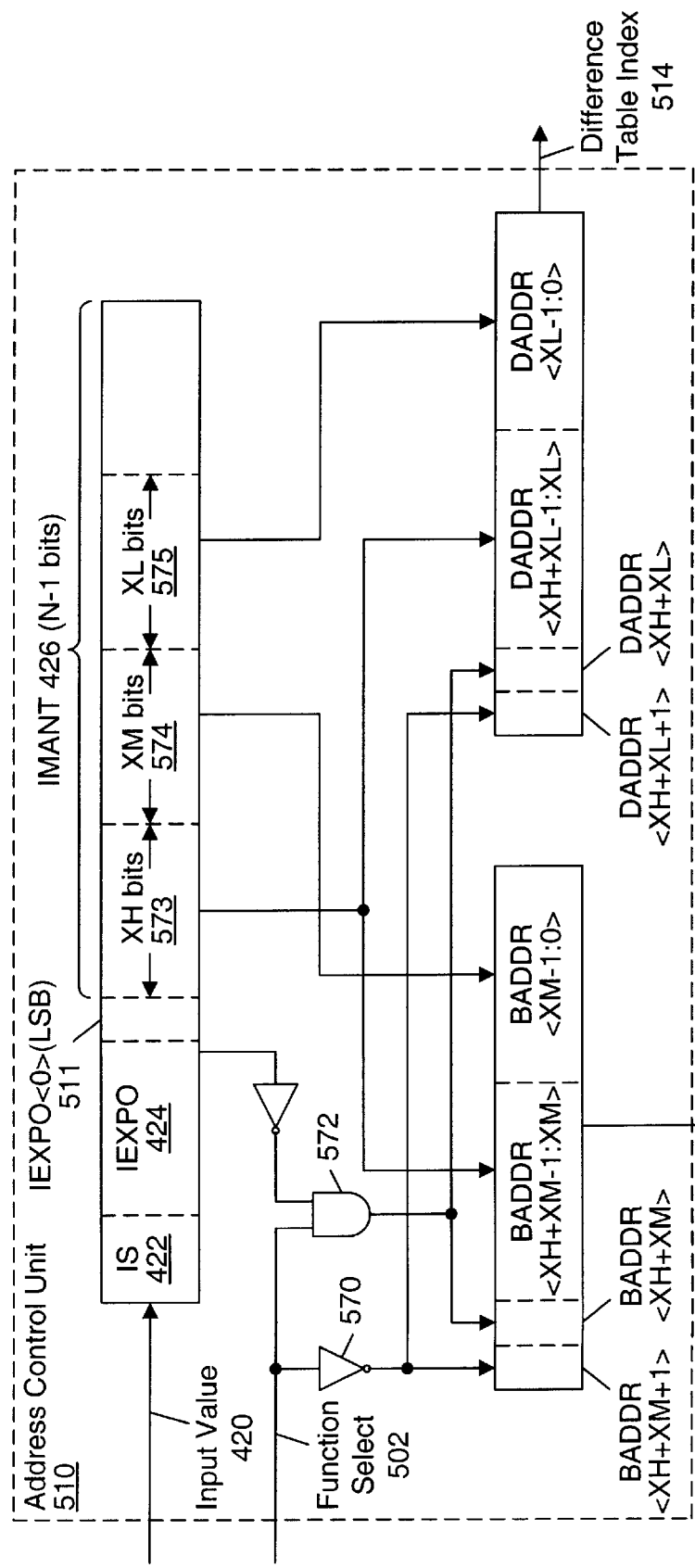
FIG. 12 is one embodiment of an address control unit within the bipartite look-up table of FIG. 11.

Turning now to FIG. 12, a block diagram of address control 510 within multi-function look-up table 500 is depicted according to one embodiment of the present invention. Address control unit 510 receives input value 420 and function select signal 502 and generates base table index 512 and difference table index 514.

Input value 420 includes sign bit field 422 having a value IS, exponent field 424 having a value IEXPO (the biased exponent value), and mantissa field 426 having a value IMANT. As shown, mantissa field 426 includes three bit groups (573, 574, and 575) usable to form indices 512 and 514. Because input value 420 is used to select base/difference values for both the reciprocal and reciprocal square root functions, these bit groups are equivalent to the bit groups of FIGS. 8B and 9A. More specifically, group 573 is equivalent to groups 430 and 460, respectively, since group 573 is usable to specify an interval for both functions within table 500. Similarly, group 574 is equivalent to groups 432/462, while group 575 is equivalent to groups 434/464. Bit group 573 is shown as having XH bits, where XH=HR=HS. Similarly, bit group has XM bits (XM=MR=MS), while bit group 575 has XL bits (XL=LR=LS). Bit groups 573–575 are combined as shown in FIGS. 8C–D (and 9B and 9C) in order to form portions of indices 512 and 514.

The most significant bits of indices 512 and 514 are used for function selection. In the embodiment shown in FIG. 12, the most significant bit is low when function select signal 502 is high (as signal 502 is conveyed through an inverter 570). Thus, when signal 502 is high, base table index 512 and difference table index 514 access entries within table regions 522A–B and 532A–B (the reciprocal square root entries). Conversely, when signal 502 is low, indices 512 and 514 access entries within table regions 522C and 532C (the reciprocal entries). The second most significant bit of indices 512/514 is used (if applicable) to select one of the two binades for the reciprocal square root entries. That is, these bits select between table regions 522A and 522B in base table 520, and between table regions 532A and 532B in difference table 530. Furthermore, these second-most-significant bits are only set (in the embodiment shown) if function select 502 is high and the LSB of the true exponent value is set (meaning the true exponent is odd and the biased exponent, 511, is even). Thus, these bits are not set if function select 502 is low, indicating the reciprocal function.

The equations for index 512 in the embodiment shown in FIG. 11 may be summarized as follows:

$$BADDR{<}XH{+}XM{+}1{>}{=}!(\text{Signal }502), \qquad (11)$$

$$BADDR{<}XH{+}XM{>}{=}!IEXPO{<}0{>}\&\&(502), \qquad (12)$$

$$BADDR{<}XH{+}XM{-}1{:}XM{>}{=}IMANT{<}N{-}2{:}N{-}1{-}XH{>}, \qquad (13)$$

$$BADDR{<}XM{-}1{:}0{>}{=}IMANT{<}N{-}2{-}XH{:}N{-}1{-}XH{-}XM{>}. \qquad (14)$$

Similarly, the equations for index 514 are as follows:

$$DADDR{<}XH{+}XL{+}1{>}{=}!(\text{Signal }502), \qquad (15)$$

$$DADDR{<}XH{+}XL{>}{=}!IEXPO{<}0{>}\&\&(502), \qquad (16)$$

$$DADDR{<}XH{+}XL{-}1{:}XL{>}{=}IMANT{<}N{-}2{:}N{-}1{-}XH{>}, \qquad (17)$$

$$DADDR{<}XL{-}1{:}0{>}{=}IMANT{<}N{-}2{-}XH{-}XM{:}N{-}1{-}XH{-}XM{-}XR{>}. \qquad (18)$$

Other equations are possible in other embodiments.

Figure 13A:
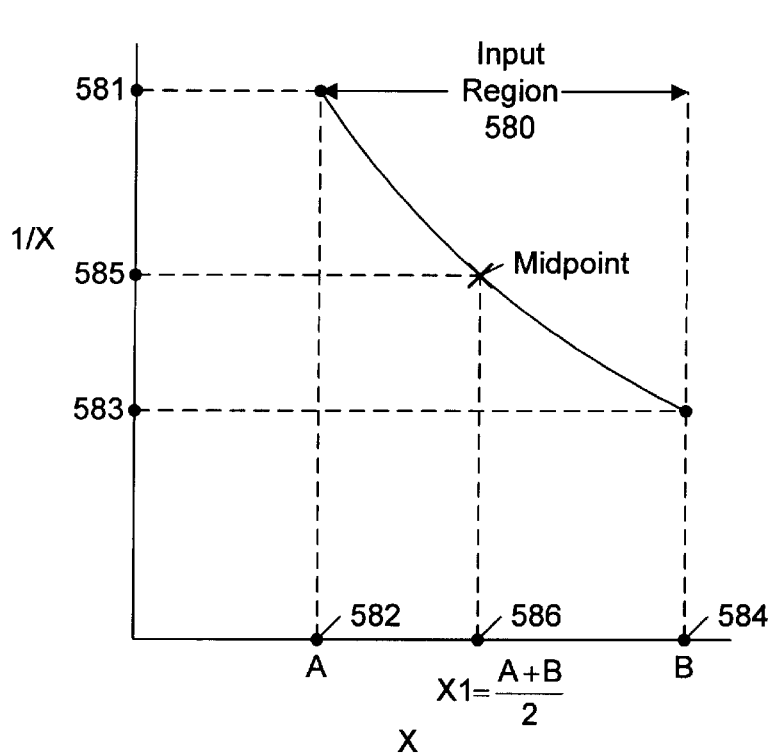
FIG. 13A is a graph depicting a prior art midpoint calculation for a bipartite look-up table.

Turning now to FIG. 13A, a graph 578 of an input region 580 is shown according to a prior art method for calculating a midpoint value. Input region 580 is bounded by input values A and B, located at points 582 and 584, respectively, on the horizontal axis of graph 578. Point A corresponds to an output value (for the reciprocal function) denoted by point 581 on the vertical axis of graph 578. Point B, likewise, corresponds to an output value denoted by point 583.

As shown in FIG. 13A, a midpoint X1 is calculated for input region 580 by determining the input value halfway in between A and B. This input value X1 is located at point 586, and corresponds to an output value denoted by point 585 on the vertical axis. In prior art systems, the output value corresponding to point 585 is chosen to represent all values in input region 580. An output value calculated in this manner has the effect of minimizing maximum relative error over a given input region. Although this midpoint calculation method is shown in FIG. 13A for the reciprocal function, this method is applicable to any function.

Figure 13B:
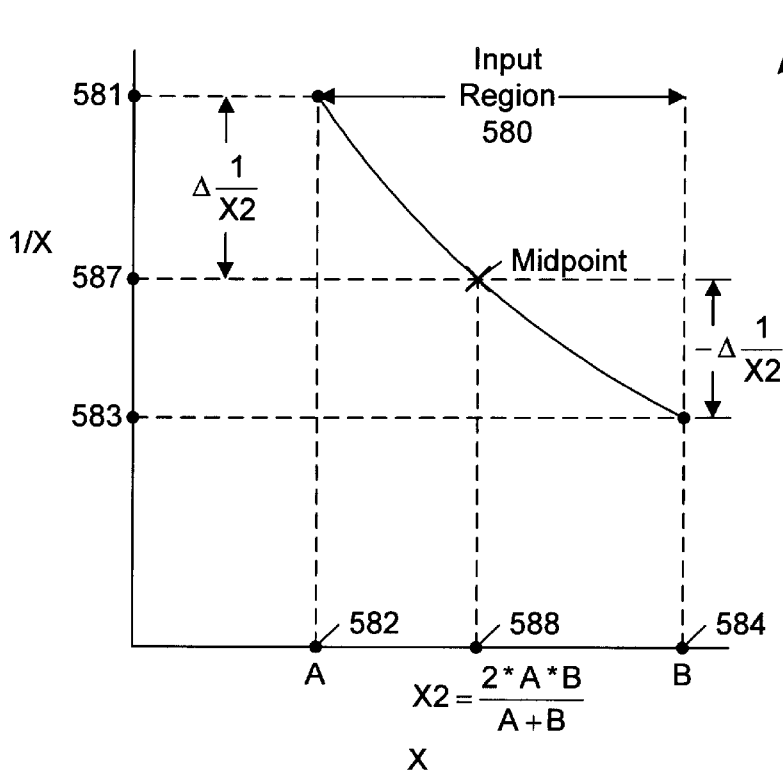
FIG. 13B is a graph depicting a midpoint calculation for a bipartite look-up table according to one embodiment of the present invention.

Turning now to FIG. 13B, a graph 590 of input region 580 is shown according to a method for calculating a midpoint value according to the present invention. As in FIG. 13A, input region 580 is bounded by input values A and B located at points 582 and 584, respectively. Input value A corresponds to an output value denoted by point 581, while input value B corresponds to an output value at point 583. As depicted in FIG. 13B, both of these output values correspond to the reciprocal function.

Unlike the midpoint calculation in FIG. 13A, the midpoint calculation in FIG. 13B produces an output value for input region 580 which minimizes absolute error. The midpoint calculation is FIG. 13A is independent of the particular function, since the midpoint (X1) is simply calculated to be halfway between the input values (A and B) which bound region 580. Midpoint X2, on the other hand, is calculated such that the corresponding output value, denoted by point 587, is halfway between the output values (581 and 583) corresponding to the input region boundaries. That is, the difference between 581 and 587 is equal to the difference between 587 and 583. The calculation of X2 (denoted by point 588) is function-specific. For the reciprocal function, X2 is calculated as follows:

$$\frac{1}{A} - \frac{1}{X2} = \frac{1}{M2} - \frac{1}{B}, \text{ or} \qquad (19)$$

$$A \cdot X2 \cdot B\left(\frac{1}{A} - \frac{1}{X2} = \frac{1}{X2} - \frac{1}{B}\right), \qquad (20)$$

which simplifies to $$X2 \cdot B - A \cdot B = A \cdot B - A \cdot X2 \qquad (21).$$

Solving for X2 gives $$X2 = \frac{2 \cdot A \cdot B}{A + B}.$$

Calculating X2 for the reciprocal square root function gives $$X2 = \frac{4 \cdot A \cdot B}{A + 2\sqrt{A \cdot B} + B}.$$

Calculation of midpoint X2 in this manner ensures that maximum absolute error is minimized by selecting f(X2) as the output value for input region 580. This is true because the absolute error at both A and B is identical with f(X2) selected as the output value for region 580.

Another method of calculating error, "ulp" (unit in last place) error, is currently favored by the scientific community. Generally speaking, ulp error is scaled absolute error where the scale factor changes with a) precision of the floating point number and b) the binade of a particular number. For example, for IEEE single-precision floating point format, 1 ulp for a number in binade [1,2) is $2^{-23}$. The ulp method of midpoint calculation is utilized below in a method for computation of base and difference table values in one embodiment of the present invention.

Figure 14A:
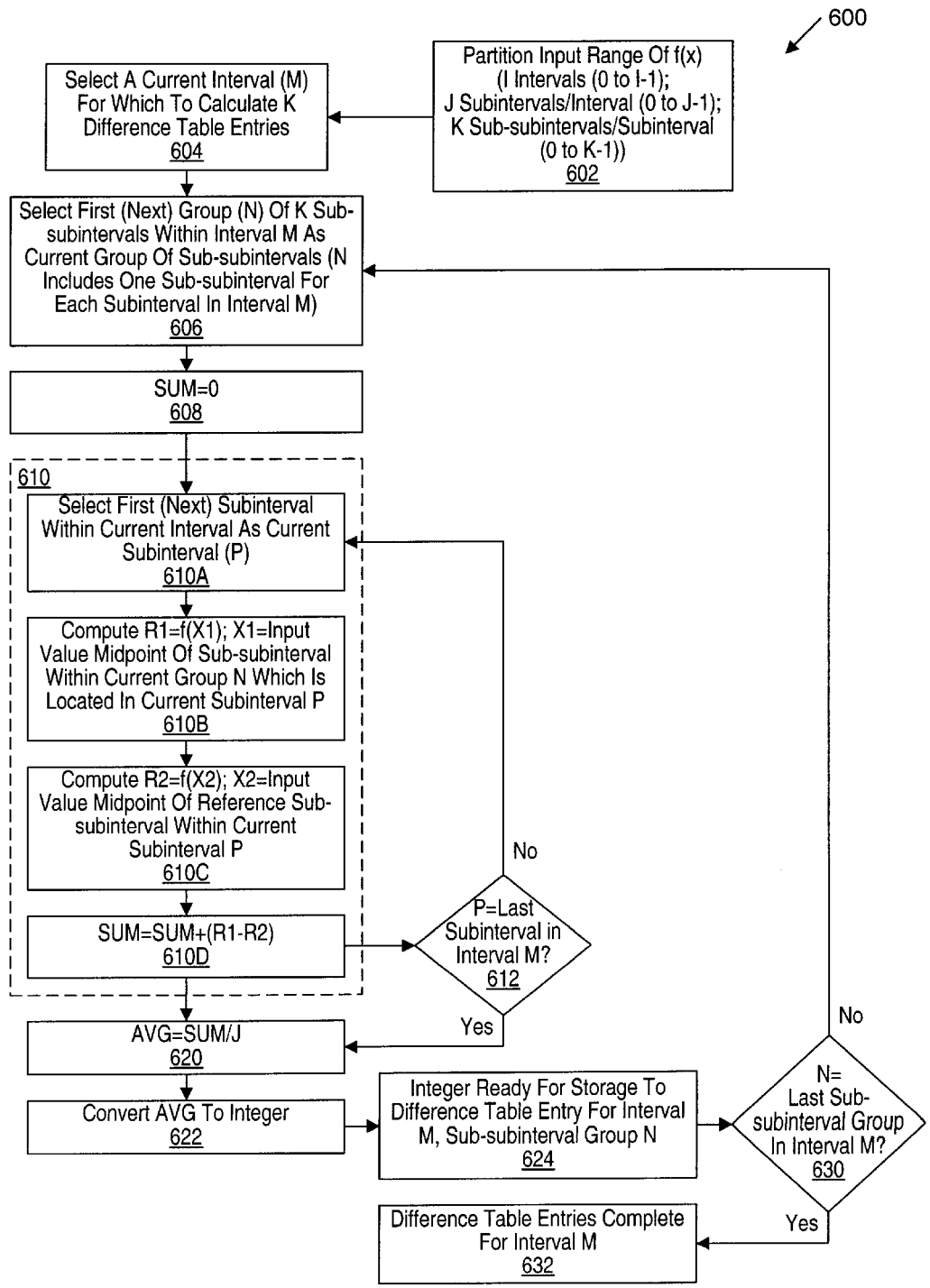
FIG. 14A is a flowchart depicting a method for computation of difference table entries for a bipartite look-up table according to one embodiment of the present invention.
Figure 14B:
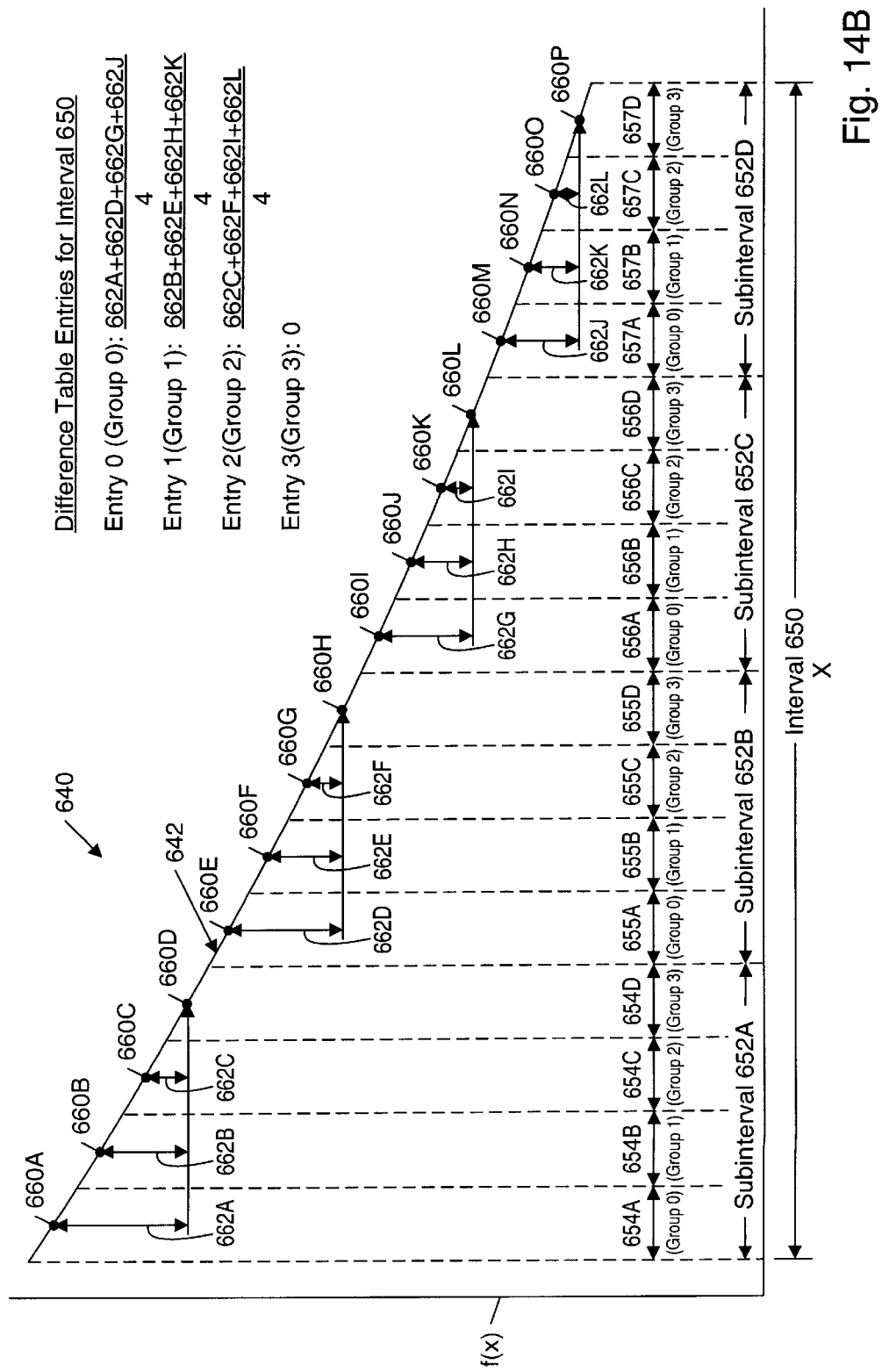
FIG. 14B is a graph depicting difference value averaging over a portion of a function f(x) partitioned for use with a bipartite look-up table according to one embodiment of the present invention.

Turning now to FIG. 14A, a flowchart of a method 600 for calculations of difference table entries is depicted according to one embodiment of the present invention. Method 600 is described with further reference to FIG. 14B, which is a graph 640 of a portion 642 of function f(x). Method 600 is described generally in relation to FIG. 14A, while FIG. 14B illustrates a particular instance of the use of method 600.

Method 600 first includes a step 602, in which the input range of f(x) is partitioned into I intervals, J subintervals/interval, and K sub-subintervals/subinterval. The partitioning choice directly affects the accuracy of the look-up table, as a more narrowly-partitioned input range generally leads to reduced output error. FIG. 14B illustrates a single interval 650 of the input range of f(x). Interval 650 is partitioned into four subintervals, 652A–D, each of which is further partitioned into four sub-subintervals. Subinterval 652A, for example, includes sub-subintervals 654A, 654B, 654C, and 654D.

These partitions affect the input regions for which difference table entries are generated. In one embodiment, a difference table entry is generated for each group of sub-subintervals in a subinterval of an input range. As described above, each sub-subinterval group includes one sub-subinterval/subinterval within a given interval, with each sub-subinterval in the group having the same relative position within its respective subinterval. For example, if an interval includes eight subintervals of eight sub-subintervals each, a difference table according to one embodiment of the present invention would include eight entries for the interval. Consider FIG. 14B. Interval 650 is shown as having four subintervals 652 of four sub-subintervals each. Each sub-subinterval within a given subinterval belongs to one of four groups. Each group has a number of entries equal to the number of subintervals/interval, and each member of a particular group has the same relative position within its respective subinterval. Group 2, for instance, includes sub-subintervals 654C, 655C, 656C, and 657C, all of which are the third sub-subinterval within their respective subintervals. As will be described below, a difference table entry is computed for each group within a given interval.

In step 604, a particular interval M is selected for which to calculate K difference table entries. In FIG. 14B, interval M is interval 650. Method 600 is usable to calculate difference table entries for a single interval; however, the method may be applied repeatedly to calculate entries for each interval in an input range.

Next, in step 606, a group of K sub-subintervals (referred to in FIG. 14A as "Group N") are selected for which to calculate a difference entry. Typically, the groups are selected sequentially. For example, in FIG. 14B, group 0 (consisting of sub-subintervals 654A, 655A, 656A, and 657A) would typically be selected first.

In step 608, a counter variable, SUM, is reset. As will be described, this variable is used to compute an average of the difference values in each group. SUM is reset each time a new group of sub-subintervals is processed.

Step 610 includes several sub-steps which make up a single iteration in a loop for calculating a single difference entry. In sub-step 610A, a subinterval is selected in which to begin computation of the current difference table entry being calculated. The current subinterval is referred to as "P" within FIG. 14A. Subintervals are also typically selected in sequential order. For example, in calculating table entries for groups 0–3 in FIG. 14B, computations first begin in sub-interval 652A, then subinterval 652B, etc.

In sub-step 610B, the midpoint (X1) and corresponding output value (R=f(X1)) are computed for the sub-subinterval of group N located within current subinterval P. For example, if the current subinterval P is 652A and the current group N is group 0, the midpoint and corresponding output value are computed for sub-subinterval 654A. In one embodiment, midpoint X1 is calculated as shown in FIG. 13B. That is, the midpoint X1 is calculated such that f(X1) is halfway between the maximum and minimum output values for the sub-subinterval for which the midpoint is being calculated. The midpoints (660A–660P) are shown in FIG. 14B for each sub-subinterval within interval 650.

Next, in sub-step 610C, a midpoint(X2) and corresponding output value (R2=f(X2)) are calculated for a reference sub-subinterval within current subinterval P. This reference sub-subinterval is the sub-subinterval within current sub-interval P for which the base value is ultimately calculated (as is described below with reference to FIG. 15A). In one embodiment, the reference sub-subinterval is the last sub-subinterval within a given subinterval. In FIG. 14B, for example, the reference sub-subintervals are those in group 3.

In sub-step 610D, the difference between the midpoint output values (R1–R2) is added to the current value of SUM. This effectively keeps a running total of the difference values for the group being calculated. The difference values for each sub-subinterval are represented by vertical lines 662 in FIG. 14B. Note that the difference value for the reference sub-subinterval in each subinterval is zero.

In step 612, a determination is made whether current subinterval P is the last (J–1th) subinterval in interval M. If P is not the last subinterval in interval M, processing returns to step 610. In sub-step 610A, the next subinterval (sequential to that previously processed) is selected as subinterval P. Computations are made in sub-steps 610B–C of the midpoint and midpoint output values for the group N sub-subinterval and reference sub-subinterval within the newly-selected subinterval P. The new R1–R2 computation is performed and added to the SUM variable in sub-step 610D. This processing continues until all subintervals in interval M have been traversed. For example, step 610 is executed four times to calculate a difference table entry for group 0 sub-subintervals in interval 650.

When step 612 is performed and current subinterval P is the last subinterval in interval M, method 600 continues with step 620. In step 620, the current value of SUM is divided by the number of times step 610 was performed (which is equal to the number of subintervals/intervals, or J). This operation produces a value AVG, which is indicative of the average of the difference values for a particular group. Entry 0 of the difference table for interval 650 corresponds to the sub-subintervals in group 0. This entry is calculated by the average of difference values represented by lines 662A, 662D, 662G, and 662J in FIG. 14B. Note that the difference entries for group 3 in this embodiment are zero since group 3 includes the reference sub-subintervals.

In step 622, the floating-point value AVG is converted to an integer format for storage in difference table 530. This may be performed, in one embodiment, by multiplying AVG by $2^{P+1}$, where P is the number of bits in base table 520, and the additional bit accounts for the implicit leading one bit. A rounding constant may also be added to the product of AVG*$2^{P+1}$ in one embodiment.

In step 624, the integer computed in step 622 may be stored to the difference table entry for interval M, sub-subinterval group N. Typically, all the entries for an entire table are computed during design of a microprocessor which includes table 500. The table values are then encoded as part of a ROM within the microprocessor during manufacture.

In step 630, a determination is made whether group N is the last sub-subinterval group in interval M. If group N is not the last group, method 600 continues with step 606, in which the next sub-subinterval group is selected. The SUM variable is reset in step 608, and difference table entry for the newly-selected sub-subinterval group is computed in steps 610, 612, 620, and 622. When group N is the last sub-subinterval group in interval M, method 600 completes with step 632. As stated above, method 600 is usable to calculate difference tables for a single interval. Method 600 may be repeatedly executed to calculate difference table entries for additional intervals of f(x).

As described above, the base value in look-up table 500 includes an approximate function value for each subinterval. As shown in FIG. 14B, this approximate function value for each subinterval corresponds to the midpoint of the reference sub-subinterval within the subinterval. For example, the approximate function value for subinterval 652A in FIG. 14B is the function value at midpoint 660D of sub-subinterval 654D. An approximate function value for another sub-subinterval within subinterval 652A may then be calculated by adding the function value at midpoint 660D with the difference table entry for the appropriate interval/sub-subinterval group.

Because of the averaging between subintervals used to compute difference table 530 entries, for a given interval (interval 650, for example), the differences (and, therefore, the result of the addition) are too small in the first subintervals in interval 650 (i.e., subintervals 652A–B). Conversely, the differences (and result of the addition) are too large in the last subintervals in interval 650 (subintervals 652C–D). Furthermore, within a given subinterval, error varies according to the sub-subinterval position due to difference value averaging. Difference value error from averaging refers to the difference between a computed midpoint for a sub-subinterval and the actual table output (a base-difference sum) for the group which includes the sub-subinterval. Within the last sub-subinterval in a subinterval, this error is zero. In the first sub-subinterval within the subinterval, however, this error is at its maximum. In one embodiment, it is desirable to compute base table entries for a given subinterval such that maximum error is distributed evenly throughout the subinterval. Graphs illustrating the result of this process are depicted in FIGS. 14A–D, with an actual method for this computation described with reference to FIG. 16.

Figure 15A:
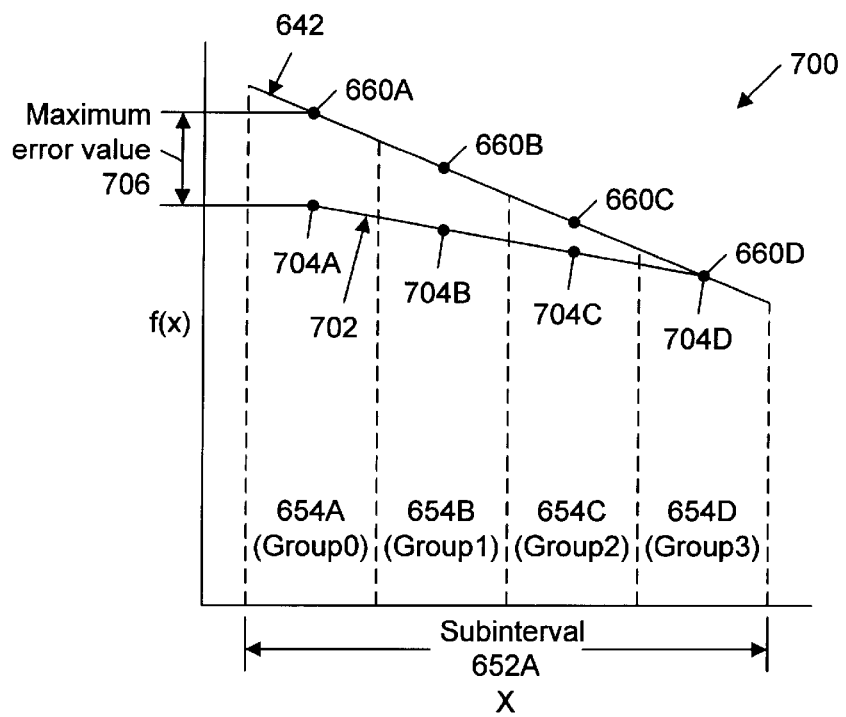
FIG. 15A–B are graphs comparing table output values for a portion of a function f(x) to computed midpoint values for the function portion.

Turning now to FIG. 15A, a graph 700 is shown of a portion of function f(x) (denoted by reference numeral 642) from FIG. 14B. Only subinterval 652A is shown in FIG. 15A. As in FIG. 14B, subinterval 652A includes four sub-subintervals (654A–D), each having a corresponding midpoint 660. Graph 700 further includes a line segment 702, which illustrates the actual look-up table outputs 704 for each sub-subinterval 654 of subinterval 652A.

These actual look-up table outputs are equal to the base entry plus the corresponding difference table entry. As described above, for the first subintervals (such as 652A) in subinterval 650, the result of the base-difference addition is smaller than computed midpoints for the sub-subintervals in the subinterval. This can be seen in FIG. 15A, as actual look-up table output 704A is less than computed midpoint 660A. Furthermore, for the embodiment shown in FIG. 15A, the sub-subinterval with the maximum error within subinterval 652A is sub-subinterval 654A. The difference between computed midpoint 660A and actual look-up table output 704A is shown as maximum error value 706. Actual look-up table outputs 704B and 704C in sub-subintervals 654B and 654C are also less than their respective computed midpoints, but not by as large a margin as in sub-subinterval 654A. Sub-subinterval 654D, however, is used as the reference sub-subinterval, and as a result, actual look-up table output 704D is equal to computed midpoint 660D.

Figure 15B:
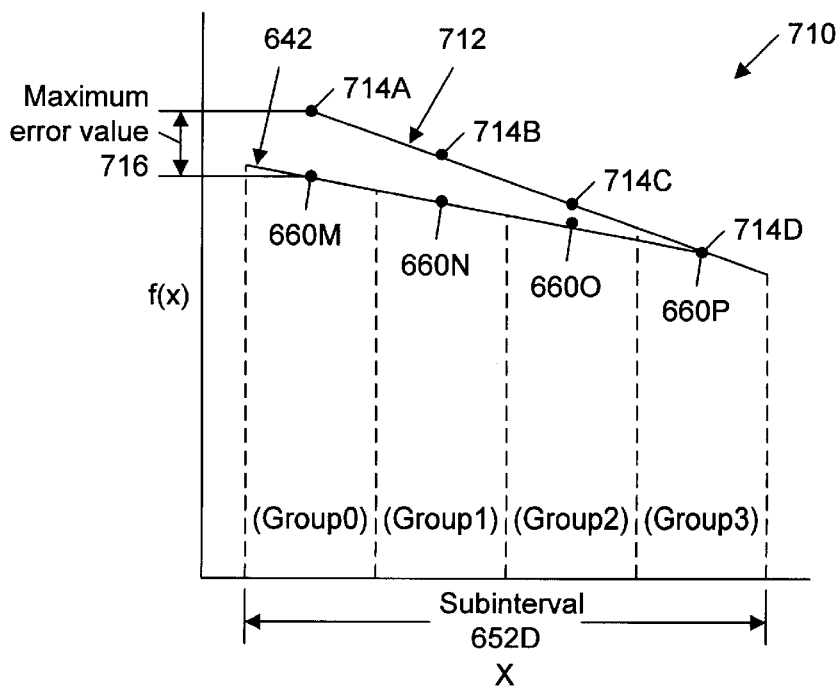

Turning now to FIG. 15B, a graph 710 is shown of a portion of function f(x) (denoted by reference numeral 642) from FIG. 14B. Only subinterval 652D is shown in FIG. 15B. As in FIG. 14B, subinterval 652D includes four sub-subintervals (657A–D), each having a corresponding midpoint 660. Graph 710 further includes a line segment 712, which depicts the actual look-up table outputs 714 for each sub-subinterval 657 of subinterval 652D.

As in FIG. 15A, these actual look-up table outputs are equal to the base entry plus the corresponding difference table entry. As described above, for the last subintervals (such as 652D) in subinterval 650, the result of the base/difference addition is larger than computed midpoints for the sub-subintervals in the subinterval. This can be seen in FIG. 15B, as actual look-up table output 714A is greater than computed midpoint 660M. For the embodiment shown in FIG. 15B, the sub-subinterval with the maximum error is within subinterval 652D is sub-subinterval 657A. This difference between computed midpoint 660M and actual look-up table output 714A is shown as maximum error value 716. Actual look-up table outputs 714B and 714C in sub-subintervals 657B and 657C are also greater than their respective computed midpoints, but not by as large a margin as in sub-subinterval 657A. Sub-subinterval 657D, however, is used as the reference sub-subinterval, and as a result, actual look-up table output 714D is equal to computed midpoint 660P.

In one embodiment, the base value for a subinterval may be adjusted (from the function output value at the midpoint of the reference sub-subinterval) in order to more evenly distribute the maximum error value. Although adjusting the base values increases error within the reference sub-subinterval, overall error is evenly distributed across all sub-subintervals in a subinterval. This ensures that error is minimized within a subinterval no matter which sub-subinterval bounds the input value.

Figure 15C:
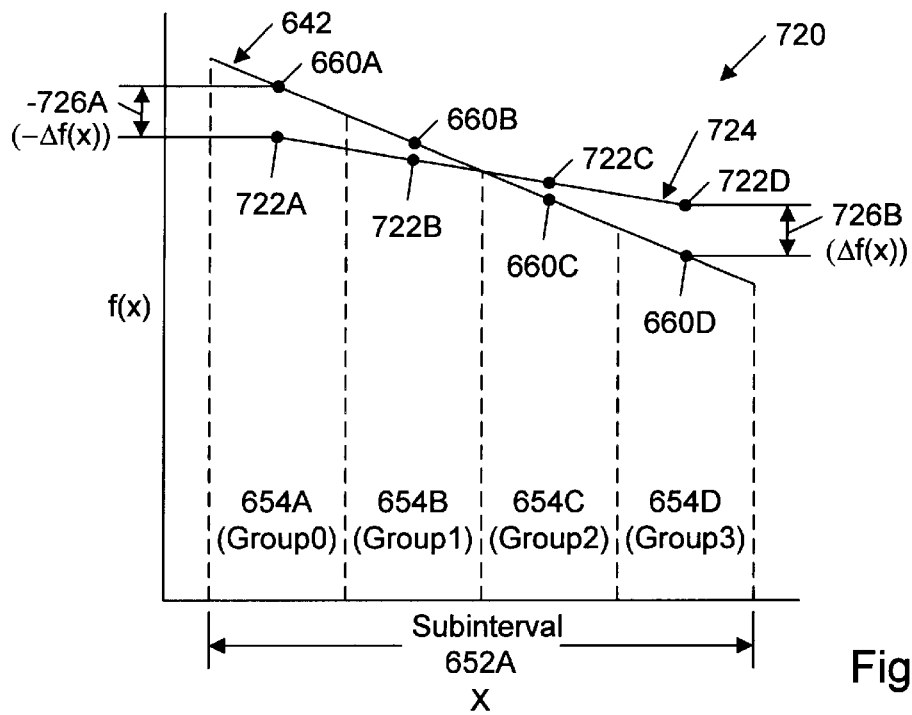
FIG. 15C–D are graphs comparing table outputs with adjusted base values for a portion of a function f(x) to computed midpoint values for the function portion.

Turning now to FIG. 15C, a graph 720 is depicted which illustrates portion 642 of function f(x) corresponding to subinterval 652A. Graph 720 also includes a line segment 724, which is equivalent to line segment 702 with each table value adjusted by an offset. Values making up line segment 724 are adjusted such that the error in sub-subinterval 654A is equal to the error in sub-subinterval 654D. The error in sub-subinterval 654A is given by the difference between computed midpoint 660A of sub-subinterval 654A and adjusted look-up table output value 722A. This difference is denoted by −Δf(x) 726A in FIG. 15C. The error in sub-subinterval 654D is given by the difference between adjusted look-up table output value 722D and computed midpoint 660D of subinterval 654D. This difference is denoted by Δf(x) 726B. Thus, the error in sub-subinterval 654A and the error in sub-subinterval 654D are equal in magnitude, but opposite in sign.

Figure 15D:
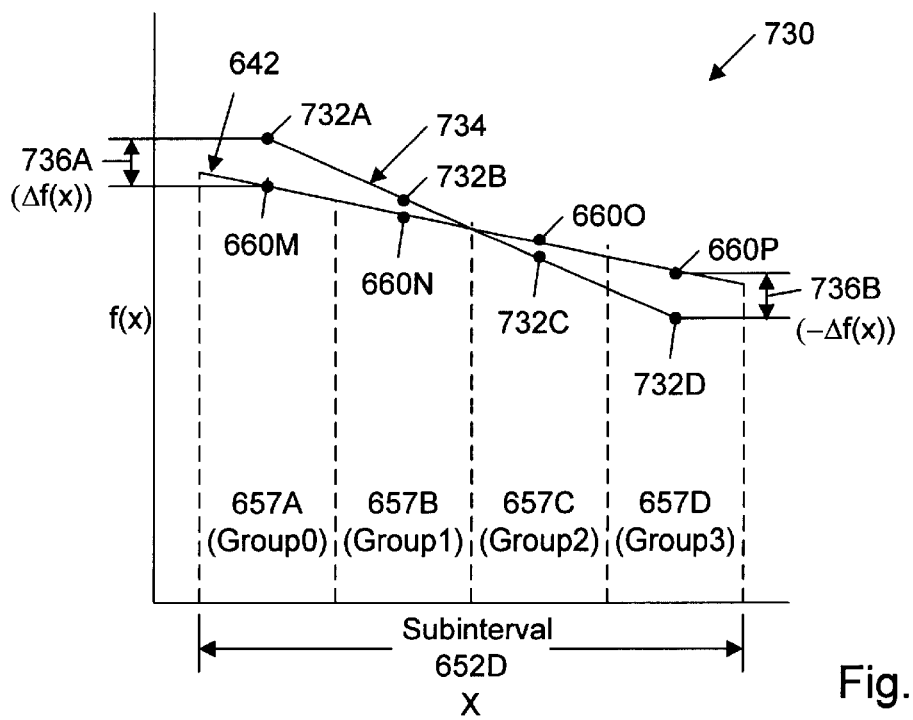

Turning now to FIG. 15D, a graph 730 is depicted which illustrates portion 642 of function f(x) corresponding to subinterval 652D. Graph 730 also includes a line segment 734, which is equivalent to line segment 712 with each table value adjusted by an offset. Unlike the offset value in FIG. 15C, which is positive, the offset value in FIG. 15D is negative. With this offset value, the values which make up line segment 734 are adjusted such that the error in sub-subinterval 657A is equal to the error in sub-subinterval 657D. The error in sub-subinterval 657A is given by the difference between adjusted look-up table output value 732A and computed midpoint 660M. This difference is denoted by Δf(x) 736A in FIG. 15D. Similarly, the error in sub-subinterval 657D is given by the difference between computed midpoint 660P of subinterval 657D and adjusted look-up table output value 732D. This difference is denoted by −Δf(x) 736B. Thus, the error in sub-subinterval 657A and the error in sub-subinterval 657D are equal in magnitude, but opposite in sign. The method by which the adjustments of FIGS. 14C and 14D are made is described below with reference to FIG. 16.

Figure 16:
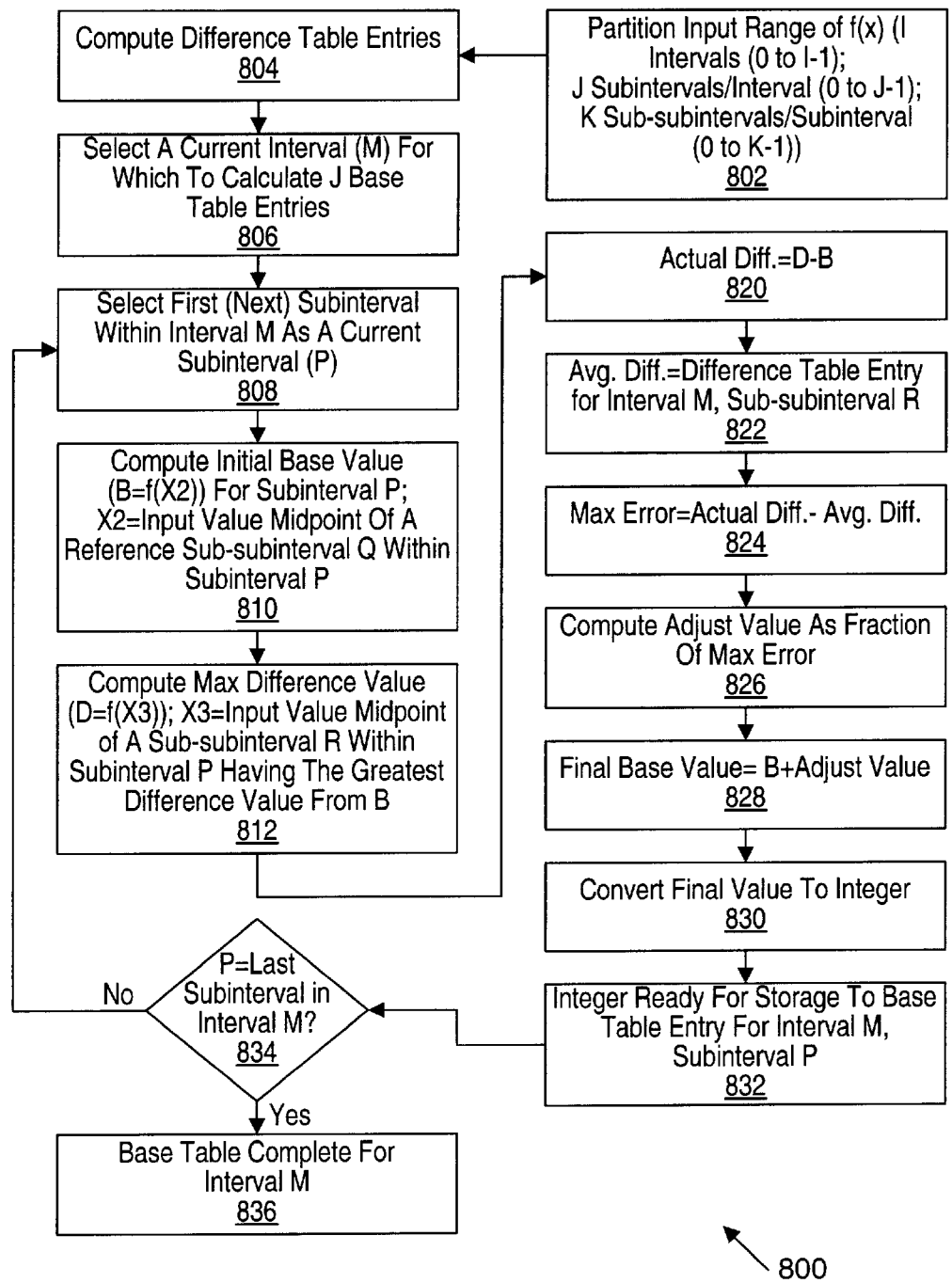
FIG. 16 is a flowchart depicting a method for computation of base table entries for a bipartite look-up table according to one embodiment of the present invention.

Turning now to FIG. 16, a flowchart of a method 800 is depicted for computing base table entries for a bipartite look-up table such as look-up table 500 of FIG. 11. Method 800 may be performed in conjunction with method 600 of FIG. 14A, or with other methods employed for computation of difference table entries. As needed, method 800 is also described with reference to FIGS. 14A–D.

Method 800 first includes a step 802 in which the input range of f(x) is partitioned. Step 802 is identical to step 602 of method 600, since base and difference values are computed according to the same partitioning. Method 800 next includes step 804, in which difference table entries are calculated. This may be performed using method 600 or other alternate methods. In the embodiment shown in FIG. 16, difference entries are computed prior to base values since difference values are referenced during base value computation (as in step 822 described below).

Once difference table entries are calculated, computation of base table values begins with step 806, in which an interval (referred to as "M") is selected for which to calculate the entries. As with method 600, method 800 is usable to calculate entries for a single interval of a function input range. The steps of method 800 may be repeatedly performed for each interval in an input range. In the embodiment shown in FIG. 16, J base tables (one for each subinterval) are calculated for interval M. In step 810, one of the J subintervals of interval M is selected as a current subinterval P. The first time step 808 is performed during method 800, the first subinterval within interval M is selected as subinterval P. Successive subintervals are selected on successive executions of step 808. Currently selected subinterval P is the subinterval for which a base table entry is being calculated.

In step 810, an initial base value (B) is computed for currently selected subinterval P. In one embodiment, B corresponds to the function value at the midpoint (X2) of a predetermined reference sub-subinterval, where the midpoint is calculated as described with reference to FIG. 13B. (The midpoint of the reference sub-subinterval for subinterval P is denoted as X2 in order to be consistent with the terminology of FIG. 14A). The initial base value is thus given by the equation B=f(X2). In one embodiment of look-up table 500 (such as in FIGS. 13B and 14A–D), the reference sub-subinterval (Q) is the last, or (K−1)th, sub-subinterval in each subinterval, where each subinterval includes sub-subintervals 0 to K−1.

Next, in step 812, a function value (D) is computed which corresponds to the midpoint (X3) of a sub-subinterval (R) within subinterval P which has the greatest difference value from reference sub-subinterval Q. If reference sub-subinterval Q is the last sub-subinterval in subinterval P, then sub-subinterval R is the first, or 0th, sub-subinterval. For example, in FIG. 15A, sub-subinterval 654D is reference sub-subinterval Q, while sub-subinterval 654A is sub-subinterval R. The function value D is thus given by the equation D=f(X3), where X3 is the midpoint of sub-subinterval R calculated as described above with reference to FIG. 13B in one embodiment.

In step 820, the difference, (referred to as "actual difference" in FIG. 16), is computed between D and B. This is representative of what the maximum difference value would be for subinterval P if difference value averaging were not employed, since sub-subinterval R has the maximum difference value in relation to sub-subinterval Q as described above. Next, in step 822, the difference table entry (computed previously in step 804) is referenced for sub-interval P, sub-subinterval R. (In method 600, however, a dedicated difference table entry does not exist solely for subinterval P, sub-subinterval R. Rather, a difference table exists for subinterval P and a group of sub-subintervals N within interval M which includes sub-subinterval R). The difference table entry referenced in step 822 is referred to as the averaged difference value ("avg. diff.").

In step 824, the maximum error that results from using averaged difference values is calculated. This is performed by setting max error =actual diff.−avg. diff. As shown in FIGS. 14C and 14D, the maximum error from the averaged difference table values occurs in the first sub-subinterval in the subinterval (e.g., sub-subintervals 654A and 657A). In fact, the max error computed in step 824 of method 800 is equal to max error values 706 and 716 in FIGS. 14C and 14D.

In order to distribute the maximum error of step 824 throughout subinterval P, an adjust value is computed as a fraction of max error in step 826. In order to evenly distribute the error throughout the subinterval, the adjust value is computed as half the maximum error value. Then, in step 828, the final base value is computed from the initial base value B by adding the adjust value.

In step 830, the final value as computed in step 828 is converted to an integer value. As with the integer conversion of the difference value in step 622 of method 600, the conversion of step 830 may be performed in one embodiment by multiplying the final base value by $2^{P-1}$ and adding an optional rounding constant. In alternate embodiments, the integer conversion may be performed differently. In step 832, the converted integer value is ready for storage to the base table entry for interval M, subinterval P. The base table entries may be stored to the table one-by-one, but typically they are all computed then stored to the ROM that includes the look-up table.

In step 834, a determination is made of whether subinterval P is the last subinterval in interval M. If more subintervals exist, method 800 continues with step 808. In step 808, a next subinterval within interval M is selected, and the succeeding steps are usable to calculate the base value for the newly-selected subinterval. On the other hand, if P is the last subinterval in interval M, method 800 concludes with step 836.

Methods for calculation of difference and base table entries are described in a general manner with reference to FIGS. 13A and 15, respectively. Source code which implements these methods (for the reciprocal and reciprocal square root functions) is shown below for one embodiment of the present invention. Note that the #define's for HIGH, MID, and LOW effectively partition the input range of these functions into four intervals, four subintervals/interval, and four sub-subintervals/subinterval.

```
#define HIGH    2
#define MID     2
#define LOW     2
#define OUT     16
#define OUTP    16
#define OUTQ    (OUTP-(HIGH+MID)+1)
#define RECIPENTRIES (1L << (HIGH+MID))
#define ROOTENTRIES (2L << (HIGH+MID))
#define BIAS 127L         /* exponent bias for single precision format */
#define POW2(x) (1L << (x)) /* helper function */
typedef union {
  float    f;
  unsigned long i;
} SINGLE;
#define SIGN_SINGLE(var) ((((var).i)&0x80000000L)?1L:0L)     /* sign bit */
#define EXPO_SINGLE(var) ((((var).i)>>23L)&0xFFL    /* 8 bit exponent */
#define MANT_SINGLE(var) (((var).i)&0x7FFFFFL)    /* 23 bit mantissa */
#define SETSIGN_SINGLE(var,sign) \
(((var).i)=((sign)&1)?(((var).i)|0x80000000L):(((var).i)&0x7FFFFFFFL))
#define SETEXPO_SINGLE(var,expo) \
(((var).i)=(((var).i)&0x807FFFFFL)|(((expo)&0xFFL)<<23))
#define SETMANT_SINGLE(var,mant) \
(((var).i)=(((var).i)&0xFF800000L)|(((mant)&0x7FFFFFL)))
extern unsigned long rom_p[ ];
extern unsigned long rom_q[ ];
#define TRUE 1
#define FALSE 0
#define HIGHMID (HIGH+MID)
#define HIGHLOW (HIGH+LOW)
#define ALL (HIGH+MID+LOW)
#define POW2(x) (1L <<(x))
#define CONCAT(a,b,c) ((0X7FL <<23)|\
             (((a) & (POW2(HIGH) - 1)) << (23 - (HIGH)))|\
             (((b) & (POW2(MID) - 1)) << (23 - (HIGHMID)))|\
             (((c) & (POW2(LOW) - 1)) << (23 - (ALL))))
#define CONCAT2(e,a,b,c) (((e) << 23)|\
             (((a) & (POW2(HIGH) - 1)) << (23 - (HIGH)))|\
             (((b) & (POW2(MID) - 1)) << (23 - (HIGHMID)))|\
             (((c) & (POW2(LOW) - 1)) << (23 - (ALL))))
void make_recip_bipartite_table (unsigned long *tablep, unsigned long *tableq)
{
  unsigned long xh, xm, xl, indexp, indexq, maxq, minq, maxp, minp;
  SINGLE    temp1, temp2;
  double    midpoint1, midpoint2;
  double    reset, sumdiff, result1, result2, adjust;
  printf ("\nCreating lookup tables . . .\n");
  for (xh = 0; xh < POW2(HIGH); xh++) {
    for (xl = 0; xl <POW2(LOW); xl++) {
      indexq = (xh << LOW)|xl;
      sumdiff = 0.0;
      for (xm = 0; xm < POW2(MID); xm++) {
        temp1.i = CONCAT (xh, xm, xl);
        temp2.i = (temp1.i (POW2(23 - ALL) - 1)) + 1;
        midpoint1 = (2.0 * temp1.f * temp2.f) / (temp1.f + temp2.f);
        temp1.i = CONCAT (xh, xm, POW2(LOW)-1);
        temp2.i = (temp1.i | (POW2(23 - ALL) - 1)) + 1;
        midpoint2 = (2.0 * temp1.f * temp2.f) / (temp1.f + temp2.f);
        sumdiff = sumdiff + ((1.0 / midpoint1) - (1.0 / midpoint2));
      }
      result = 1.0/((double)(POW2(MID))) * sumdiff;
      tableq [indexq]= (unsigned long)(POW2(OUTP+1) * result + 0.5);
    }
  }
}
```

-continued

```
for (xh = 0; xh < POW2(HIGH); xh++) {
  for (xm = xm < POW2(MID); xm++) {
    indexp = (xh << (MID)) | xm;
    temp1.i = CONCAT (xh, xm, 0);
    temp2.i = (temp1.i | (POW2(23 - ALL) - 1)) + 1;
    midpoint1 = (2.0 * temp1.f * temp2.f) / (temp1.f + temp2.f);
    result1 = 1.0 / midpoint1;
    temp1.i = CONCAT (xh, xm, POW2(LOW) - 1);
    temp2.i = (temp1.i (POW2(23 - ALL) - 1)) + 1;
    midpoint2 = (2.0 * temp1.f * temp2.f) / (temp1.f + temp2.f);
    result2 = 1.0 / midpoint2;
    adjust = 0.5 * ((result1 - result2) - (1.0/POW2(OUTP+1)) * tableq[xh << LOW]);
    tablep [indexp] = (unsigned long)(POW2(OUTP+1) * (result2 + adjust) + 0.5);
    tablep [indexp]-= (1L << OUTP); /* subtract out integer bit */
  }
 }
}
void make_recipsqrt_bipartite_table (unsigned long *tablep,
               unsigned long *tableq)
{
  unsigned long xh, xm, xl, indexp, indexq, maxq, minq, start, end,
         maxp, minp, expo;
  SINGLE    temp1, temp2;
  double    midpoint1, midpoint2;
  double    result, adjust, sumdif, result1, result2;
  printf("\nCreating lookup tables . . . \n");
  for (expo = 0x7F; expo <= 0x80; expo++) {
   for (xh = 0; xh <POW2(HIGH); xh++) {
    for (xl = 0; xl <POW2(LOW); xl++) {
    indexq = ((expo & 1) << (HIGHLOW)) (xh << LOW) | xl;
    sumdiff = 0.0;
    for (xm = 0; xm <POW2(MID); xm++) {
      temp1.i = CONCAT2 (expo, xh, xm, xl);
      temp2.i = (temp1.i (POW2(23 - ALL) - 1)) +1;
      midpoint1 = (4.0 * temp1.f* temp2.f)/
((sqrt(temp1.f)+sqrt(temp2.f))* (sqrt(temp 1.f)+sqrt(temp2.f)));
      temp1.i = CONCAT2 (expo, xh, xm, POW2(LOW)-1);
      temp2.i = (temp1.i (POW2(23 - ALL) - 1)) + 1;
      midpoint2 = (4.0 * temp1.f* temp2.f) /
((sqrt(temp 1.f)+sqrt(temp2.f))*(sqrt(temp 1.f)+sqrt(temp2.f)));
      sumdiff = sumdiff + ((1.0 / sqrt(midpoint1)) - (1.0 / sqrt(midpoint2)));
    }
    result = 1.0/((double)(POW2(MID))) * sumdiff;
    tableq [indexq] = (unsigned long)(POW2(OUTP+1) * result + 0.5);
    }
   }
   for (xh = 0; xh < POW2(HIGH); xh++) {
    for (xm = 0; xm < POW2(MID); xm++) {
    indexp = ((expo & 1) << (HIGHMID)) | (xh << (MID)) | xm;
    temp1.i = CONCAT2 (expo, xh, xm, 0);
    temp2.i = (temp1.i (POW2(23 - ALL) - 1)) + 1;
    midpoint1 = (4.0 * temp1.f* temp2.f)/
((sqrt(temp 1.f)+sqrt(temp2.f))*(sqrt(temp 1.f)+sqrt(temp2.f)));
    result1 = 1.0 / sqrt(midpoint1);
    temp1.i = CONCAT2 (expo, xh, xm,POW2(LOW) - 1);
    temp2.i = (temp1.i (POW2(23 - ALL) - 1)) + 1;
    midpoint2 = (4.0 * temp1.f * temp2.f) /
((sqrt(temp1.f)+sqrt(temp2.f))*(sqrt(temp 1.f)+sqrt(temp2.f)));
    result2 = 1.0 / sqrt(midpoint2);
    adjust = 0.5 * ((result1 - result2) - (1.0/POW2(OUTP+1)) * tableq[((expo & 1) <<
(HIGH+LOW)) | (xh << LOW)]);
    tablep [indexp] = (unsigned long)(POW2(OUTP+1) * (result2 + adjust) + 0.5);
    tablep [indexp] -= (1L << OUTP); /* subtract out integer bit */
    }
   }
  }
}
void recip_approx_bipartite (
 const SINGLE *arg,
 const unsigned long *tablep,
 const unsigned long *tableq,
 unsigned long high,
 unsigned long mid,
 unsigned long low,
 unsigned long out,
 SINGLE *approx)
{
 unsigned long expo, sign, mant, indexq, indexp, p, q;
 /* handle zero separately */
```

-continued

```
if ((arg—>i & 0x7F800000L) == 0) {
  approx—>i = (arg—>i & 0x80000000L) | 0x7F7FFFFFL;
  return;
}
/* unpack arg */
expo = (arg—>i >> 23) & 0xFF;
sign = (arg—>i >> 31) & 1;
mant = (arg—>i & 0x7FFFFFL);
/* do table lookup on tables P and Q */
indexp = (mant >> (23 - (high + mid)));
indexq = ((mant >> (23 - (high))) << low)
    ((mant >> (23 - (high+mid+low))) & (POW2(low) - 1));
p = tablep [indexp];
q = tableq [indexq];
/* generate result in single precision format */
approx—>i = ((2*BIAS + ~expo) << 23L) +
    (((p + q)) << (23L - out));
/* check for underflow */
if((((approx—>i >> 23) & 0xFFL) == 0x00L) ||
   (((approx—>i >> 23) & 0xFFL) == 0xFFL)) {
  approx—>i = 0L;
}
/* mask sign bit because exponent above may have overflowed into sign bit */
approx—>i = (approx—>i & 0x7FFFFFFFL) (sign << 31L);
}
void recipsqrt_approx_bipartite (
  const SINGLE *arg,
  const unsigned long *tablea,
  const unsigned long *tableb,
  unsigned long high,
  unsigned long mid,
  unsigned long low,
  unsigned long out,
  SINGLE *approx)
{
  unsigned long sign, mant, indexq, indexp, p, q;
  long expo;
  /* Handle zero separately. Returns maximum normal */
  if ((arg—>i & 0x7F800000L) == 0L) {
    approx—>i = 0x7F7FFFFFL | (arg—>i & 0x80000000L);
    return;
  }
  expo = (arg—>i >> 23) & 0xFFL;
  sign = (arg—>i >> 31) & 1;
  mant = (arg—>i & 0x7FFFFFL);
  indexp = ((expo & 1) << (high + mid)) | (mant >> (23 - (high + mid)));
  indexq = ((expo & 1) << (high + low)) | ((mant >> (23 - (high))) << low) |
      ((mant >> (23 - (high + mid + low))) & (POW2(low) -1));
  p = tablea [indexp];
  q = tableb [indexq];
  approx—>i = (((3*BIAS + ~expo) >> 1) << 23) +
      (((p + q)) << (23 - out));
  approx—>i |= sign << 31;
}
```

To further clarify calculation of base and difference table entries in the embodiment corresponding to the above source code, sample table portions are given below. These table portions are for the reciprocal function only, although the reciprocal square root table entries are calculated similarly. The input range (1.0 inclusive to 2.0 exclusive) for this example is divided into four intervals, four subintervals/interval, and four sub-subintervals/subinterval. The table values are only shown for the first interval (1.0 inclusive to 1.25 exclusive) for simplicity.

The difference table for this example receives a four bit index (two bits for the interval, two bits for the sub-subinterval group). The base table also receives a four bit index (two bits for the interval, two bits for the subinterval). The base table includes 16 bits, while the difference table includes 13 bits for this embodiment.

TABLE 1

| Int. | Sub int. | Sub-Sub. | A | B | A (Binary) |
|---|---|---|---|---|---|
| 0 | 0 | 0 | 1.0 | 1.015625 | 1.00 00 00 . . . |
| 0 | 0 | 1 | 1.015625 | 1.03125 | 1.00 00 01 . . . |
| 0 | 0 | 2 | 1.03125 | 1.046875 | 1.00 00 10 . . . |
| 0 | 0 | 3 | 1.046875 | 1.0625 | 1.00 00 11 . . . |
| 0 | 1 | 0 | 1.0625 | 1.078125 | 1.00 01 00 . . . |
| 0 | 1 | 1 | 1.078125 | 1.093125 | 1.00 01 01 . . . |
| 0 | 1 | 2 | 1.093125 | 1.109375 | 1.00 01 10 . . . |
| 0 | 1 | 3 | 1.109375 | 1.125 | 1.00 01 11 . . . |
| 0 | 2 | 0 | 1.125 | 1.140625 | 1.00 10 00 . . . |
| 0 | 2 | 1 | 1.140625 | 1.15625 | 1.00 10 01 . . . |
| 0 | 2 | 2 | 1.15625 | 1.171875 | 1.00 10 10 . . . |
| 0 | 2 | 3 | 1.171875 | 1.1875 | 1.00 10 11 . . . |
| 0 | 3 | 0 | 1.1875 | 1.203125 | 1.00 11 00 . . . |
| 0 | 3 | 1 | 1.203125 | 1.21875 | 1.00 11 01 . . . |

TABLE 1-continued

| Int. | Sub int. | Sub-Sub. | A | B | A (Binary) |
|---|---|---|---|---|---|
| 0 | 3 | 2 | 1.21875 | 1.234375 | 1.00 11 10 . . . |
| 0 | 3 | 3 | 1.234375 | 1.25 | 1.00 11 11 . . . |

Table 1 illustrates the partitioning of the first interval of the input range of the reciprocal function. With regard to the binary representation of A, only the six high-order mantissa bits are shown since these are the ones that are used to specify the interval, subinterval, and sub-subinterval group of the input sub-region. Note that the first group of mantissa bits of A corresponds to the interval number, the second group corresponds to the subinterval number, and the third group corresponds to the sub-subinterval group.

Table 2 shows the midpoint of each sub-subinterval (computed as in FIG. 13B), as well as the function evaluation at the midpoint and the difference value with respect to the reference sub-subinterval of the subinterval. (The reference sub-subintervals are those in group 3).

TABLE 2

| Subint. | Sub-Sub. | Midpoint (M) | f(M) = 1/M | Diff. Value |
|---|---|---|---|---|
| 0 | 0 | 1.007751938 | .992307692 | .04410751672 |
| 0 | 1 | 1.023377863 | .977156177 | .02895600156 |
| 0 | 2 | 1.039003759 | .962460426 | .01426024955 |
| 0 | 3 | 1.05462963 | .948200175 | 0 |
| 1 | 0 | 1.070255474 | .934356352 | .03920768144 |
| 1 | 1 | 1.085881295 | .920910973 | .02576230329 |
| 1 | 2 | 1.101507092 | .907847083 | .01269841270 |
| 1 | 3 | 1.117132867 | .895148670 | 0 |
| 2 | 0 | 1.132758621 | .882800609 | .03508131058 |
| 2 | 1 | 1.148384354 | .870788597 | .02306929857 |
| 2 | 2 | 1.164010067 | .859099099 | .01137980085 |
| 2 | 3 | 1.179635762 | .847719298 | 0 |
| 3 | 0 | 1.195261438 | .836637047 | .03157375602 |
| 3 | 1 | 1.210887097 | .825840826 | .0207775347 |
| 3 | 2 | 1.226512739 | .815319701 | .01025641026 |
| 3 | 3 | 1.242138365 | .805063291 | 0 |

Table 3 shows the difference value average for each sub-subinterval group. Additionally, Table 3 includes the difference average value in integer form. This integer value is calculated by multiplying the difference average by $2^{17}$, where 17 is the number of bits in the output value (including the leading one bit).

TABLE 3

| Sub-Sub. Group | Difference Average | Integer Value (hex) |
|---|---|---|
| 0 | .03749256619 | 1332 |
| 1 | .02464128453 | 0C9E |
| 2 | .01214871834 | 0638 |
| 3 | 0 | 0000 |

With regard to the base values for this example, Table 4 below shows midpoints X2 and X3. Midpoint X2 is the midpoint for the reference sub-subinterval of each subinterval, while X3 is the midpoint of the sub-subinterval within each subinterval that is furthest from the reference sub-subinterval. The table also shows the function values at these midpoints.

TABLE 4

| Subint. | Midpoint X2 | Init. Base Value (1/X2) | Midpoint X3 | 1/X3 |
|---|---|---|---|---|
| 0 | 1.05462963 | .9482001756 | 1.007751938 | .992307692 |
| 1 | 1.117132867 | .8951486698 | 1.070255474 | .934356352 |
| 2 | 1.179635762 | .8477192982 | 1.132758621 | .882800609 |
| 3 | 1.242138365 | .8050632911 | 1.195261438 | .836637047 |

Next, Table 5 below shows the actual error difference for each subinterval, computed as 1/X3−1/X2. Table 5 additionally shows the average difference value, which is equal to the previously computed difference value for sub-subinterval group 0. The difference between the actual difference and the average difference is equal to the maximum error for the subinterval. Half of this value is the adjust value.

TABLE 5

| Subint. | Actual Diff. (1/X3 − 1/X2) | Average Diff. | Maximum Error | Adjust Value |
|---|---|---|---|---|
| 0 | .044107516 | .03749256619 | .00661495 | .003307475 |
| 1 | .039207682 | .03749256619 | .001715116 | .000857558 |
| 2 | .0358081311 | .03749256619 | −.002411255 | −.001205628 |
| 3 | .031573756 | .03749256619 | −.00591881 | −.002959405 |

In Table 6, The adjust value plus the initial base value gives the final base value. This final base value is converted to an 16-bit integer value by multiplying by $2^{17}$ and discarding the most significant 1 bit (which corresponds to the integer position).

TABLE 6

| Subint. | Final Base Value | Integer Value (hex) |
|---|---|---|
| 0 | .951507651 | E72C |
| 1 | .896006228 | CAC1 |
| 2 | .846513671 | B16A |
| 3 | .802103886 | 9AAD |

As stated above, the bipartite table look-up operation is usable to obtain a starting approximation for mathematical functions such as the reciprocal and reciprocal square root implemented within a microprocessor. In one embodiment, the table look-up is initiated by a dedicated instruction within the instruction set of the microprocessor. Additional dedicated instructions may be employed in order to implement the iterative evaluations which use the starting approximation to produce the final result for these functions. This, in turn, leads to a faster function evaluation time.

In one embodiment, base and difference values calculated as described in FIGS. 13A and 15 result in table output values with minimized absolute error. Advantageously, this minimal absolute error is obtained with a bipartite table configuration, which requires less table storage than a naive table of comparable accuracy. This configuration also allows the interpolation to be achieved with a simple addition. Thus, a costly multiply or multiply-add is not required to generate the final table output, effectively increasing the performance of the table look-up operation.

Figure 17:
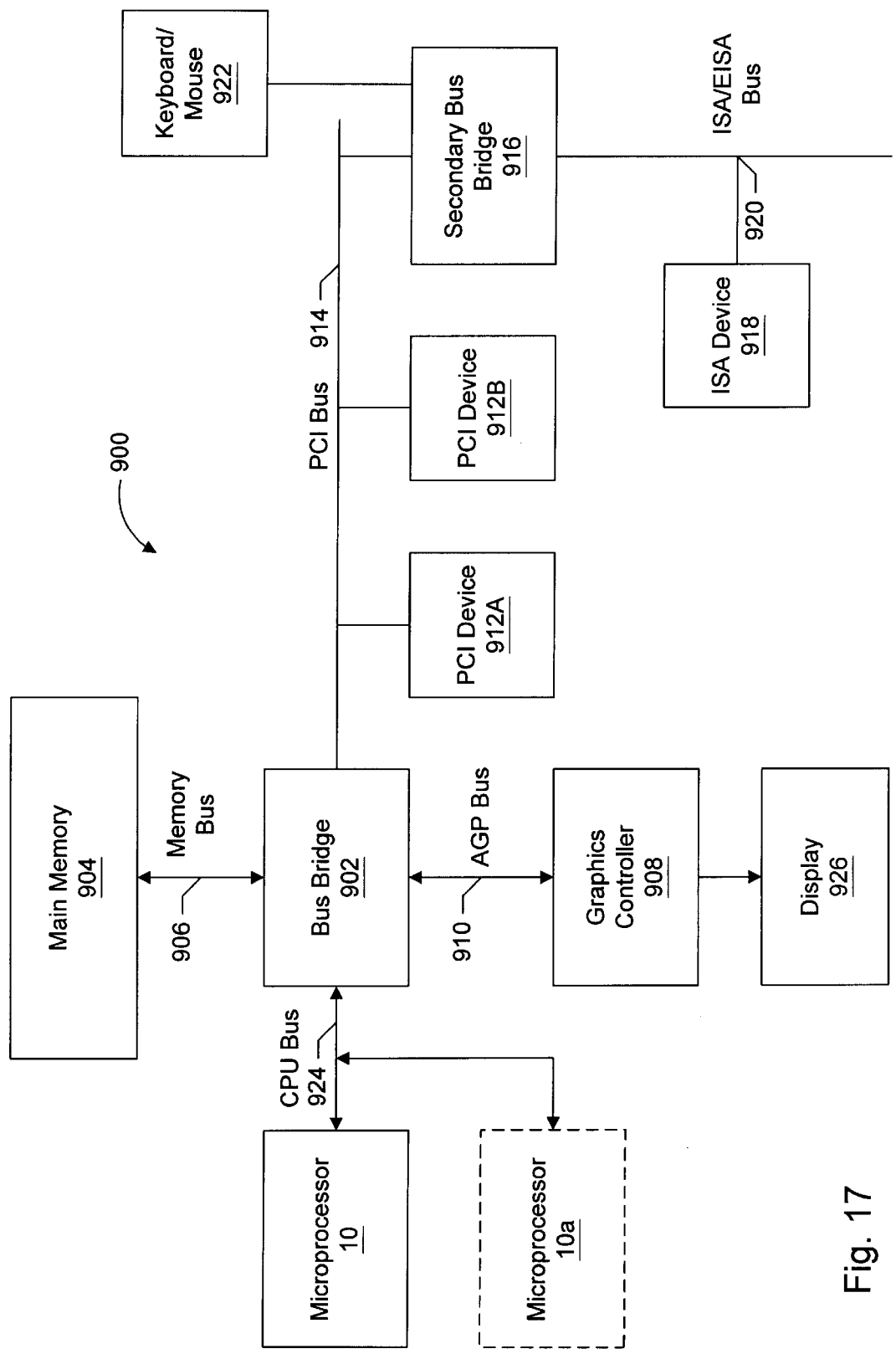
FIG. 17 is a block diagram of a computer system according to one embodiment of the present invention.

Turning now to FIG. 17, a block diagram of one embodiment of a computer system 900 including microprocessor 10 coupled to a variety of system components through a bus bridge 902 is shown. Other embodiments are possible and contemplated. In the depicted system, a main memory 904 is coupled to bus bridge 902 through a memory bus 906, and a graphics controller 908 is coupled to bus bridge 902 through an AGP bus 910. Finally, a plurality of PCI devices 912A–912B are coupled to bus bridge 902 through a PCI bus 914. A secondary bus bridge 916 may further be provided to accommodate an electrical interface to one or more EISA or ISA devices 918 through an EISA/ISA bus 920. Microprocessor 10 is coupled to bus bridge 902 through a CPU bus 924.

Bus bridge 902 provides an interface between microprocessor 10, main memory 904, graphics controller 908, and devices attached to PCI bus 914. When an operation is received from one of the devices connected to bus bridge 902, bus bridge 902 identifies the target of the operation (e.g. a particular device or, in the case of PCI bus 914, that the target is on PCI bus 914). Bus bridge 902 routes the operation to the targeted device. Bus bridge 902 generally translates an operation from the protocol used by the source device or bus to the protocol used by the target device or bus.

In addition to providing an interface to an ISA/EISA bus for PCI bus 914, secondary bus bridge 916 may further incorporate additional functionality, as desired. For example, in one embodiment, secondary bus bridge 916 includes a master PCI arbiter (not shown) for arbitrating ownership of PCI bus 914. An input/output controller (not shown), either external from or integrated with secondary bus bridge 916, may also be included within computer system 900 to provide operational support for a keyboard and mouse 922 and for various serial and parallel ports, as desired. An external cache unit (not shown) may further be coupled to CPU bus 924 between microprocessor 10 and bus bridge 902 in other embodiments. Alternatively, the external cache may be coupled to bus bridge 902 and cache control logic for the external cache may be integrated into bus bridge 902.

Main memory 904 is a memory in which application programs are stored and from which microprocessor 10 primarily executes. A suitable main memory 904 comprises DRAM (Dynamic Random Access Memory), and preferably a plurality of banks of SDRAM (Synchronous DRAM).

PCI devices 912A–912B are illustrative of a variety of peripheral devices such as, for example, network interface cards, video accelerators, audio cards, hard or floppy disk drives or drive controllers, SCSI (Small Computer Systems Interface) adapters and telephony cards. Similarly, ISA device 818 is illustrative of various types of peripheral devices, such as a modem, a sound card, and a variety of data acquisition cards such as GPIB or field bus interface cards.

Graphics controller 908 is provided to control the rendering of text and images on a display 926. Graphics controller 908 may embody a typical graphics accelerator generally known in the art to render three-dimensional data structures which can be effectively shifted into and from main memory 904. Graphics controller 908 may therefore be a master of AGP bus 910 in that it can request and receive access to a target interface within bus bridge 902 to thereby obtain access to main memory 904. A dedicated graphics bus accommodates rapid retrieval of data from main memory 904. For certain operations, graphics controller 908 may further be configured to generate PCI protocol transactions on AGP bus 910. The AGP interface of bus bridge 902 may thus include functionality to support both AGP protocol transactions as well as PCI protocol target and initiator transactions. Display 926 is any electronic display upon which an image or text can be presented. A suitable display 926 includes a cathode ray tube ("CRT"), a liquid crystal display ("LCD"), etc.

It is noted that, while the AGP, PCI, and ISA or EISA buses have been used as examples in the above description, any bus architectures may be substituted as desired. It is further noted that computer system 900 may be a multiprocessing computer system including additional microprocessors (e.g. microprocessor 10a shown as an optional component of computer system 900). Microprocessor 10a may be similar to microprocessor 10. More particularly, microprocessor 10a may be an identical copy of microprocessor 10. Microprocessor 10a may share CPU bus 924 with microprocessor 10 (as shown in FIG. 17) or may be connected to bus bridge 902 via an independent bus.

It is noted that while base and difference tables have been described above with reference to the reciprocal and reciprocal square root functions, such tables are generally applicable to any monotonically decreasing function. These tables are also applicable to a function which is monotonically decreasing over the desired input range.

In another embodiment, these base and difference tables may be modified to accommodate any monotonically increasing function(such as sqrt(x)), as well as any function which is monotonically increasing over a desired input range. In such an embodiment, the "leftmost" sub-subinterval within an interval becomes the reference point instead of the "rightmost" sub-subinterval, ensuring the values in the difference tables are positive. Alternatively, the "rightmost" sub-subinterval may still be used as the reference point if difference values are considered negative and a subtractor is used to combine base and difference table values.

Numerous variations and modifications will become apparent to those skilled in the art once the above disclosure is fully appreciated. It is intended that the following claims be interpreted to embrace all such variations and modifications.

What is claimed is:

1. A computer-readable medium encoded with a data structure, wherein the data structure comprises a bipartite look-up table usable for determining an initial estimated value for a function within a predefined input range, wherein the predefined input range is partitioned into a first number of intervals, wherein each interval is partitioned into a second number of equal subintervals, wherein each subinterval is partitioned into a third number of equal sub-subintervals, wherein said bipartite look-up table is formed by:

generating a base table entry for each subinterval of each interval;

computing one or more difference table entries for each interval, wherein computing an $I^{th}$ difference table entry for a first interval comprises:

(a) computing a first midpoint in an $I^{th}$ sub-subinterval of each subinterval of the first interval, and evaluating the function at the first midpoint to determine a first function value;

(b) computing a reference midpoint in a reference sub-subinterval of each subinterval of the first interval;

(c) evaluating the function at the reference midpoint to determine a reference function value;

(d) subtracting the first function value and the reference function value to determine a difference value for each subinterval of the first interval; and (e) averaging three or more of the difference values corresponding to three or more of the subintervals of the first interval to determine an $I^{th}$ average value, wherein said $I^{th}$ difference table entry is substantially equal to said $I^{th}$ averaged value.

2. The data structure of claim 1, wherein the function is the reciprocal function.

3. The data structure of claim 1, wherein the function is the reciprocal square-root function.

4. The data structure of claim 1, wherein the function is a monotonic function.

5. The data structure of claim 1, wherein the $I^{th}$ sub-subinterval of each subinterval of the first interval has a lower bound A and an upper bound B, wherein the first midpoint of the $I^{th}$ sub-subinterval is substantially equal to $(2*A*B)/(A+B)$.

6. The data structure of claim 1, wherein the reference sub-subinterval of each subinterval of the first interval has a lower bound A and an upper bound B, wherein the reference midpoint of the reference sub-subinterval is substantially equal to $(2*A*B)/(A+B)$.

7. The data structure of claim 1, wherein the $I^{th}$ sub-subinterval of each subinterval of the first interval has a lower bound A and an upper bound B, wherein the first midpoint of the $I^{th}$ sub-subinterval is substantially equal to $(4*A*B)/(\sqrt{A}+\sqrt{B})$.

8. The data structure of claim 1, wherein the reference sub-subinterval of each subinterval of the first interval has a lower bound A and an upper bound B, wherein the reference midpoint of the reference sub-subinterval is substantially equal to $(4*A*B)/(\sqrt{A}+\sqrt{B})$.

9. The data structure of claim 1, wherein the $I^{th}$ sub-subinterval of each subinterval of the first interval has a lower bound A and an upper bound B, wherein the first midpoint is chosen so that the first function value equals the midpoint of f(A) and f(B), wherein f(A) equals the function evaluated at lower bound A, and f(B) equals the function evaluated at the upper bound B.

10. The data structure of claim 1, wherein the reference sub-subinterval in each subinterval of the first interval is the last sub-subinterval of the subinterval.

11. The data structure of claim 1, wherein said generating a base table entry for each subinterval of the first interval comprises:
(e) subtracting the reference function value of the reference sub-subinterval of the subinterval from the first function value of an initial sub-subinterval of the subinterval to determine an actual difference;
(f) subtracting the $I^{th}$ average value corresponding to an initial difference table entry for the first interval from the actual difference to determine a maximum error;
(g) dividing the maximum error by two to determine an adjustment value;
(h) adding the adjustment value to the reference function value of the reference sub-subinterval of the subinterval to generate a sum value Q.

12. The data structure of claim 11, wherein said generating a base table entry for each subinterval of the first interval further comprises:
computing a first intermediate value according to $(2^{\wedge}(PR+1)*Q+0.5$, wherein PR is a positive integer, wherein Q is the sum value, wherein ^ denotes exponentiation;
truncating the first intermediate value to determine a first integer value;
subtracting $2^{\wedge}PR$ from the first integer value to determine the base table entry.

13. The data structure of claim 1, wherein the computer-readable medium is a read-only memory.

14. The data structure of claim 1, wherein (d) comprises summing the difference value corresponding to all of the subintervals of the first interval resulting in a final sum, and dividing the final sum by the second number.

15. The data structure of claim 1, wherein said first midpoint in the $I^{th}$ sub-subinterval of each subinterval of the first interval is chosen so that the corresponding first function value minimizes absolute error with respect to the function for input values within the $I^{th}$ sub-subinterval.

16. A processor having a memory which contains the data structure of claim 1.

17. A method for making a microprocessor, the method comprising: forming a memory which contains the data structure of claim 1.

18. A bipartite lookup table for generating approximations to a function for input values in a predefined input range, wherein the predefined input range is partitioned into a first number of intervals, wherein each interval is partitioned into a second number of equal subintervals, wherein each subinterval is partitioned into a third number of equal sub-subintervals, the bipartite look-up table comprising:
a difference table configured to store the third number of difference table entries for each interval, wherein an $I^{th}$ difference table entry for a first interval is determined by:
(a) computing a first midpoint in an $I^{th}$ sub-subinterval of each subinterval of the first interval, and evaluating the function at the first midpoint to determine a first function value;
(b) computing a reference midpoint in a reference sub-subinterval of each subinterval of the first interval, and evaluating the function at the reference midpoint to determine a reference function value;
(c) subtracting the first function value and the reference function value to determine a difference value for each subinterval of the first interval;
(d) averaging three or more of the difference values corresponding to three or more of the subintervals of the first interval to determine an $I^{th}$ average value;
a base table configured to store a base table entry for each subinterval of each interval;
an address control unit configured to receive an input value, and to extract high, middle and low order bit segments from the input value, to generate a base table index by concatenating the high and middle order bit segments, to generate a difference table index by concatenating the high and low order bit segments;
wherein the base table is further configured to receive the base table index and to provide a first base table entry in response to the base table index, wherein the difference table is further configured to receive the difference table index and to provide a first difference table entry in response to the difference table index.

19. The bipartite lookup table of claim 18 further comprising an adder configured to add the first base table entry and the first difference table entry to determine an output value.

20. The bipartite lookup table of claim 18, wherein the third number of difference table entries for each interval are determined offline by a computer executing (a), (b), (c) and (d) repeatedly for each subinterval of each interval of the predetermined input range.

21. The bipartite lookup table of claim 18, wherein the function is the reciprocal function.

22. The bipartite lookup table of claim 18, wherein the function is the reciprocal square-root function.

23. The bipartite lookup table of claim 18, wherein the function is a monotonic function.

24. The bipartite lookup table of claim 18, wherein the $I^{th}$ sub-subinterval of each subinterval of the first interval has a lower bound A and an upper bound B, wherein the first midpoint of the $I^{th}$ sub-subinterval is substantially equal to $(2*A*B)/(A+B)$.

25. The bipartite lookup table of claim 18, wherein the reference sub-subinterval of each subinterval of the first interval has a lower bound A and an upper bound B, wherein the reference midpoint of the reference sub-subinterval is substantially equal to $(2*A*B)/(A+B)$.

26. The bipartite lookup table of claim 18, wherein the $I^{th}$ sub-subinterval of each subinterval of the first interval has a lower bound A and an upper bound B, wherein the first midpoint of the $I^{th}$ sub-subinterval is substantially equal to $(4*A*B)/(\sqrt{A}+\sqrt{B})$.

27. The bipartite lookup table of claim 18, wherein the reference sub-subinterval of each subinterval of the first interval has a lower bound A and an upper bound B, wherein the reference midpoint of the reference sub-subinterval is substantially equal to $(4*A*B)/(4A+4B)$.

28. The bipartite lookup table of claim 18, wherein the $I^{th}$ sub-subinterval of each subinterval of the first interval has a lower bound A and an upper bound B, wherein the first midpoint is chosen so that the first function value equals the midpoint of f(A) and f(B), wherein f(A) equals the function evaluated at lower bound A, and f(B) equals the function evaluated at the upper bound B.

29. The bipartite lookup table of claim 18, wherein reference sub-subinterval in each subinterval of the first interval is the last sub-subinterval of the subinterval.

30. The bipartite lookup table of claim 18, wherein the base table entry for each subinterval of the first interval is generated by:

(e) subtracting the reference function value of the reference sub-subinterval of the subinterval from the first function value of an initial sub-subinterval of the subinterval to determine an actual difference;

(f) subtracting the $I^{th}$ average value corresponding to an initial difference table entry for the first interval from the actual difference to determine a maximum error;

(g) dividing the maximum error by two to determine an adjustment value;

(h) adding the adjustment value to the reference function value of the reference sub-subinterval of the subinterval to generate a sum value Q.

31. The bipartite lookup table of claim 30, wherein the base table entry for each subinterval of each interval is determined offline by a computer executing (e), (f), (g) and (h).

32. The bipartite lookup table of claim 18, wherein said first midpoint in the $I^{th}$ sub-subinterval of each subinterval of the first interval is chosen so that the corresponding first function value minimizes absolute error with respect to the function for input values within the $I^{th}$ sub-subinterval.

* * * * *

UNITED STATES PATENT AND TRADEMARK OFFICE
CERTIFICATE OF CORRECTION

PATENT NO. : 6,223,192 B1
DATED : April 24, 2001
INVENTOR(S) : Stuart F. Oberman; Norbert Juffa It is certified that error appears in the above-identified patent and that said Letters Patent is hereby corrected as shown below:

Column 39, claim 12,
Line 57, please insert the symbol -- ^ -- after "value, wherein" in place of the letter -- A --.

Column 41, claim 27,
Line 17, please insert -- ($\sqrt{A} + \sqrt{B}$) -- after "(4*A*B)/" in place of (4A+4B).

Signed and Sealed this

Twentieth Day of November, 2001

*Attest:*

*Attesting Officer*

NICHOLAS P. GODICI
*Acting Director of the United States Patent and Trademark Office*